(12) United States Patent
Nakatogawa et al.

(10) Patent No.: US 11,599,000 B2
(45) Date of Patent: Mar. 7, 2023

(54) DISPLAY PANEL AND ELECTRONIC DEVICE

(71) Applicant: Japan Display Inc., Tokyo (JP)

(72) Inventors: Hirondo Nakatogawa, Tokyo (JP); Yoshiro Aoki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/849,812

(22) Filed: Jun. 27, 2022

(65) Prior Publication Data
US 2022/0413329 A1 Dec. 29, 2022

(30) Foreign Application Priority Data
Jun. 28, 2021 (JP) .............................. JP2021-106649

(51) Int. Cl.
G09G 3/36 (2006.01)
G02F 1/1368 (2006.01)
G02F 1/1362 (2006.01)
G02F 1/1343 (2006.01)
G02F 1/133 (2006.01)
H01L 27/12 (2006.01)

(52) U.S. Cl.
CPC ........ G02F 1/1368 (2013.01); G02F 1/13306 (2013.01); G02F 1/134309 (2013.01); G02F 1/136209 (2013.01); G02F 1/136286 (2013.01); G09G 3/3696 (2013.01); *G02F 2202/28* (2013.01); *G09G 2300/0426* (2013.01); *G09G 2330/02* (2013.01); *H01L 27/124* (2013.01)

(58) Field of Classification Search
CPC ............. G02F 1/1368; G02F 1/136209; G02F 1/136286; G02F 2202/28; G09G 3/3696; G09G 2300/0426; G09G 2330/02; H01L 27/124
See application file for complete search history.

(56) References Cited

U.S. PATENT DOCUMENTS

| 5,130,571 | A | * | 7/1992 | Carroll | .................... | H03K 4/00 |
| | | | | | | 327/365 |
| 8,629,860 | B2 | * | 1/2014 | Omoto | ................. | G09G 3/3266 |
| | | | | | | 345/204 |
| 2003/0011584 | A1 | | 1/2003 | Azami et al. | | |
| 2005/0248388 | A1 | * | 11/2005 | Choi | .................... | G09G 3/3696 |
| | | | | | | 327/536 |
| 2008/0180356 | A1 | * | 7/2008 | Minami | ............... | G09G 3/3266 |
| | | | | | | 345/55 |

FOREIGN PATENT DOCUMENTS

| JP | 2006-180033 A | 7/2006 |
| JP | 2021-028695 A | 2/2021 |

\* cited by examiner

*Primary Examiner* — Sanghyuk Park
(74) *Attorney, Agent, or Firm* — Michael Best & Friedrich LLP

(57) ABSTRACT

According to one embodiment, a display panel includes scanning lines, signal lines, a pixel switching element, a pixel electrode, and a first control switch including first control switching elements. Each of the first control switching elements is composed of a transistor and includes a gate electrode, a source electrode, and a drain electrode. The scanning lines electrically connected to the gate electrodes of the first control switching elements are different from each other. The drain electrodes of the first control switching elements are electrically bundled and are connected to power source voltage output terminal of the first control switch.

16 Claims, 25 Drawing Sheets

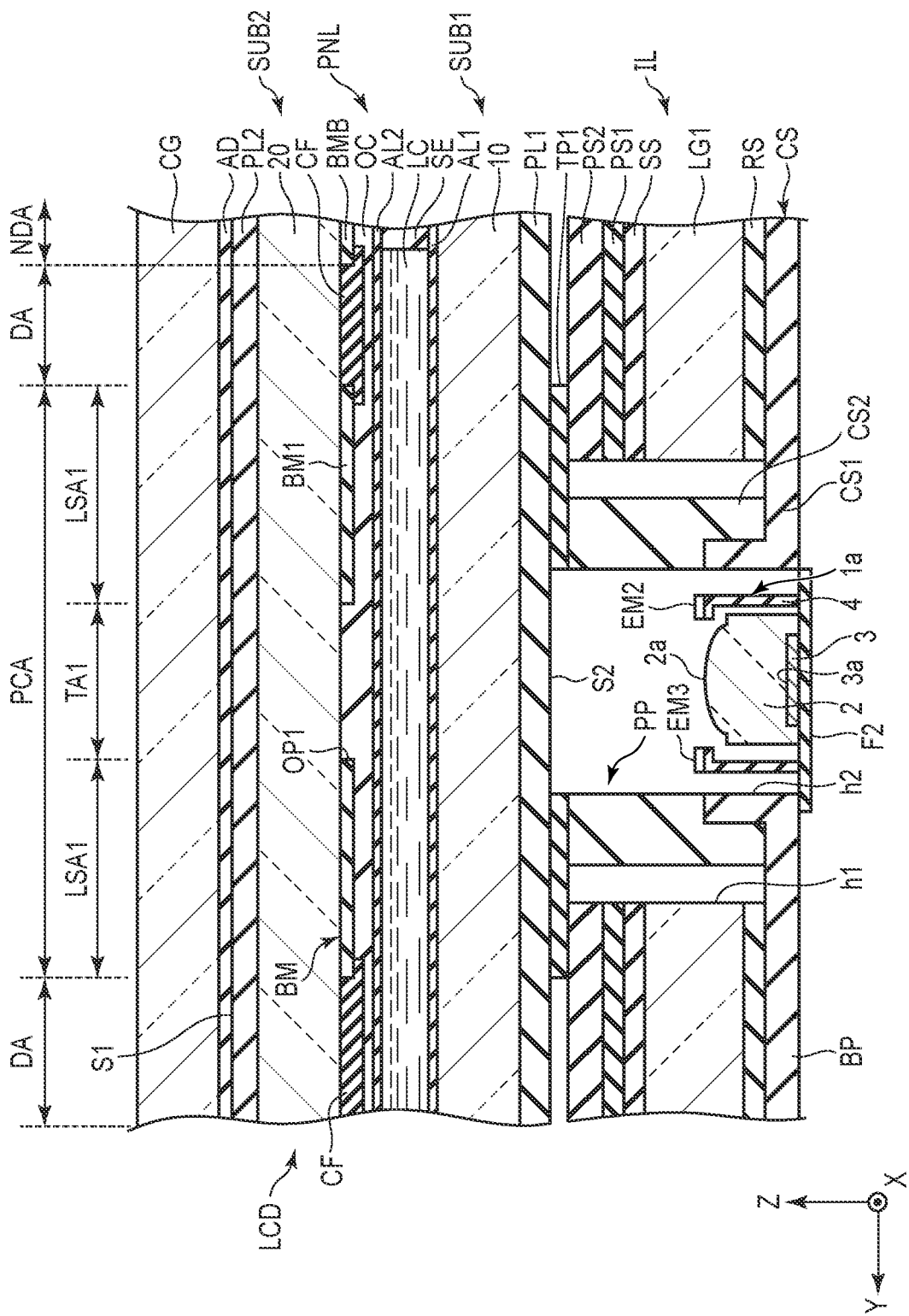
F I G. 2

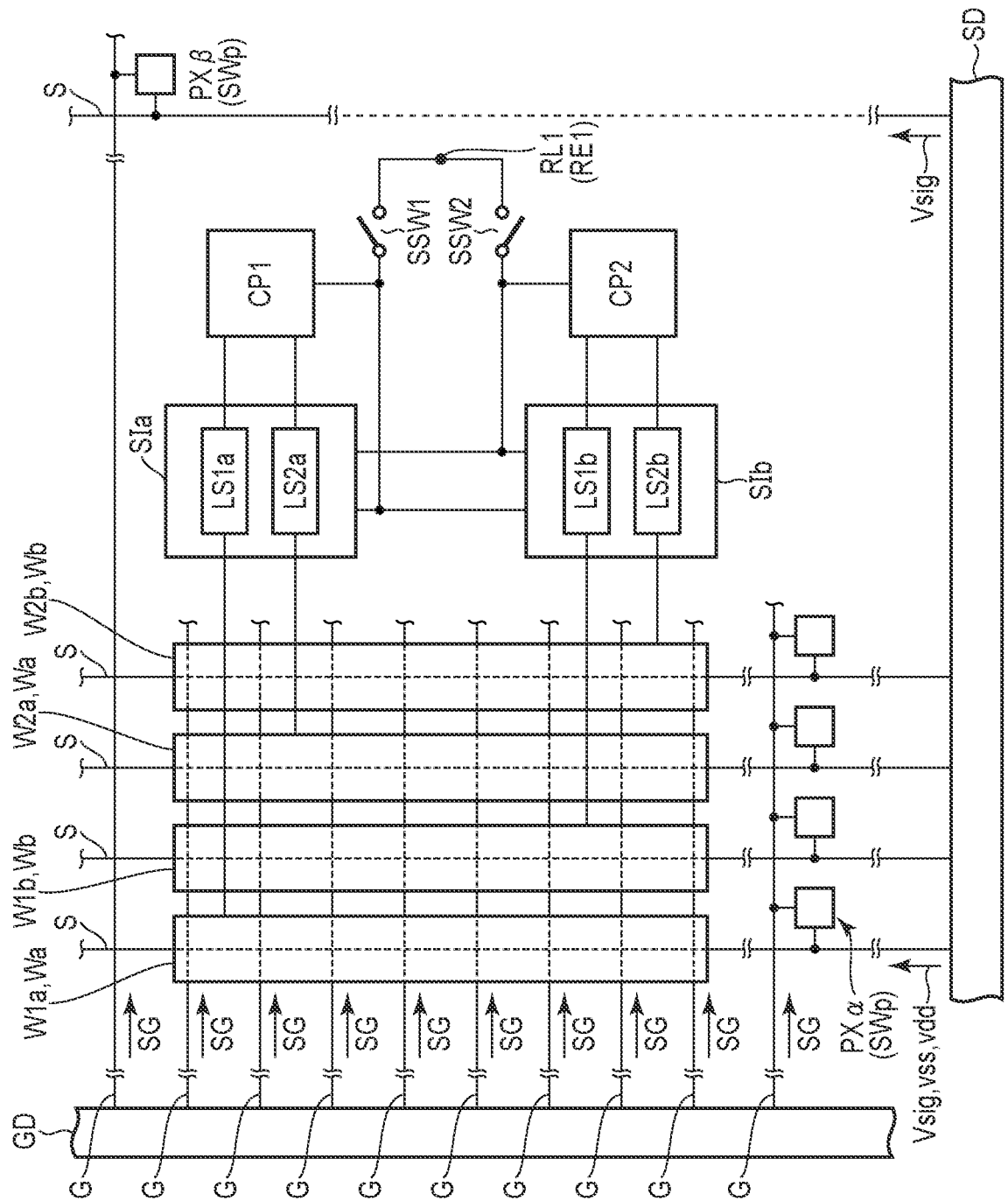
F I G. 11

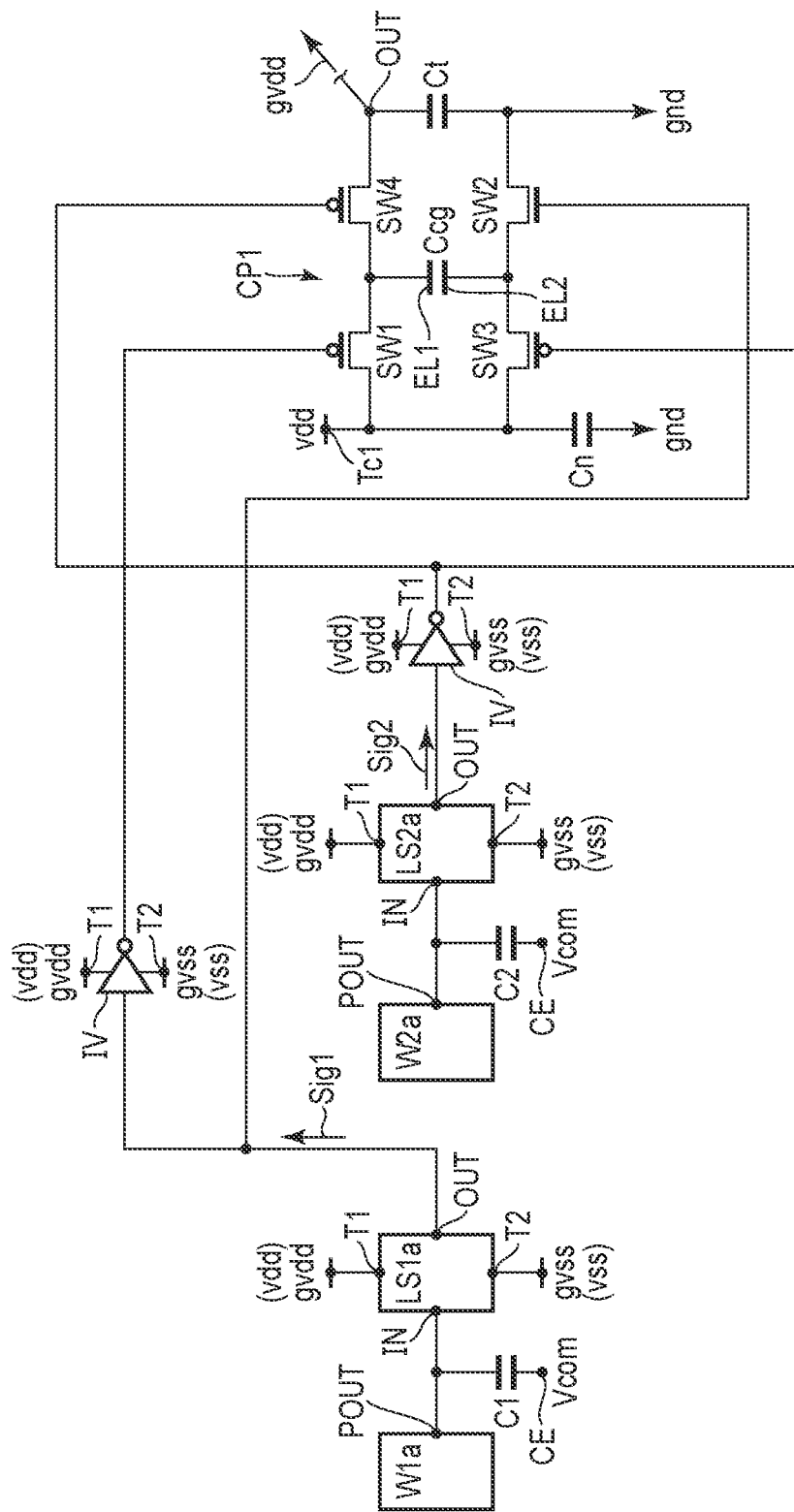
F I G. 13

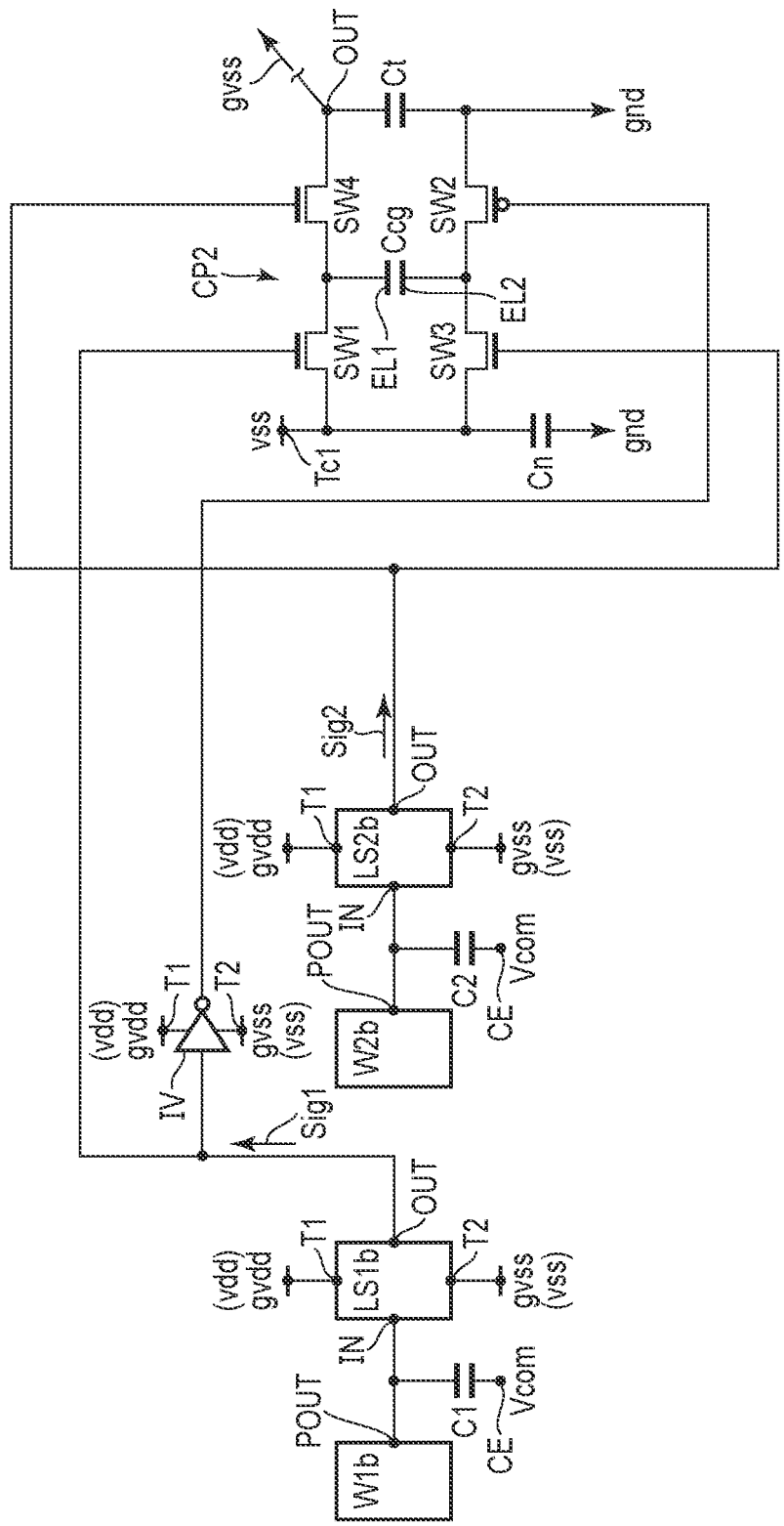
F I G. 16

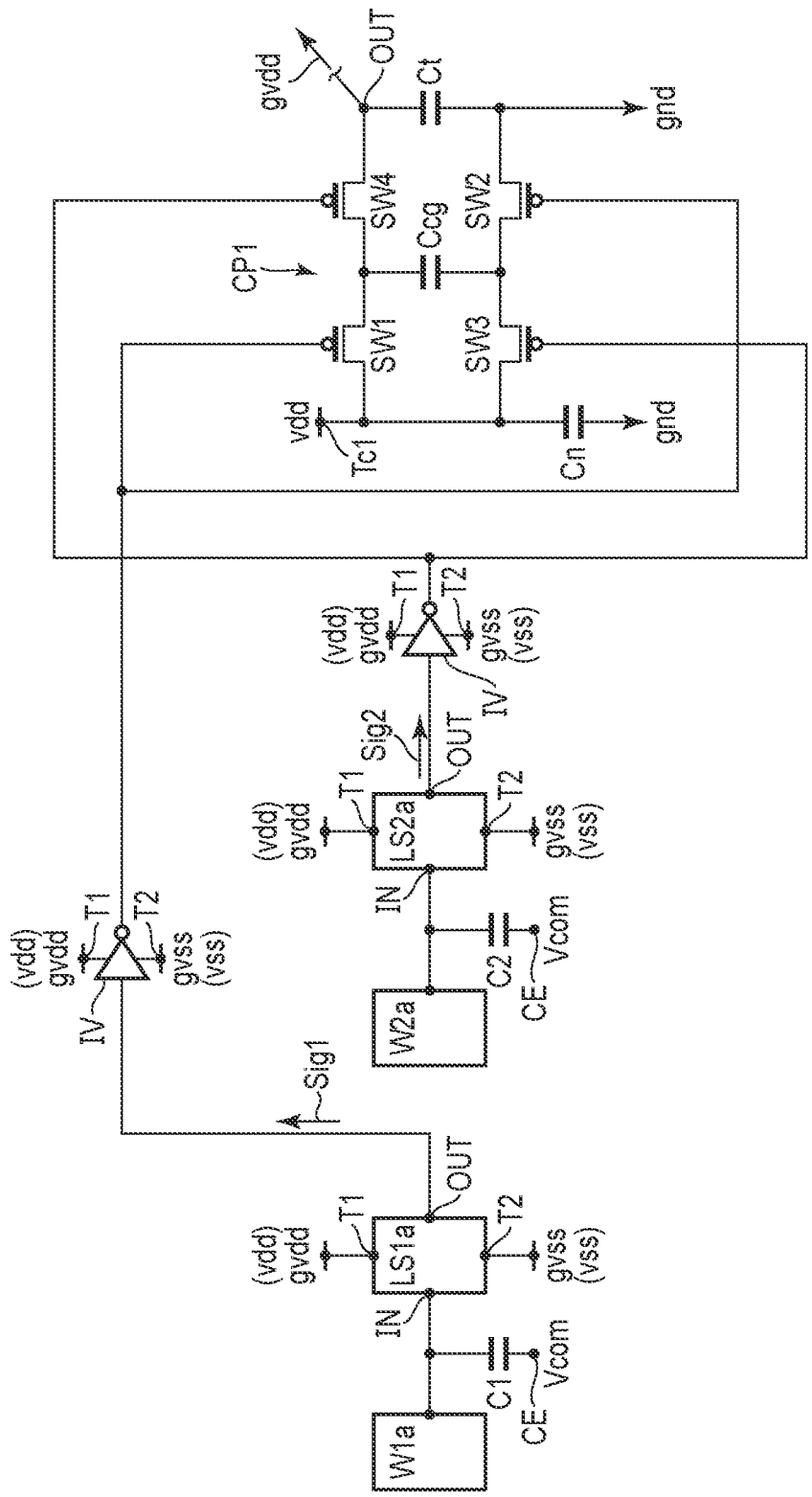
F I G. 18A

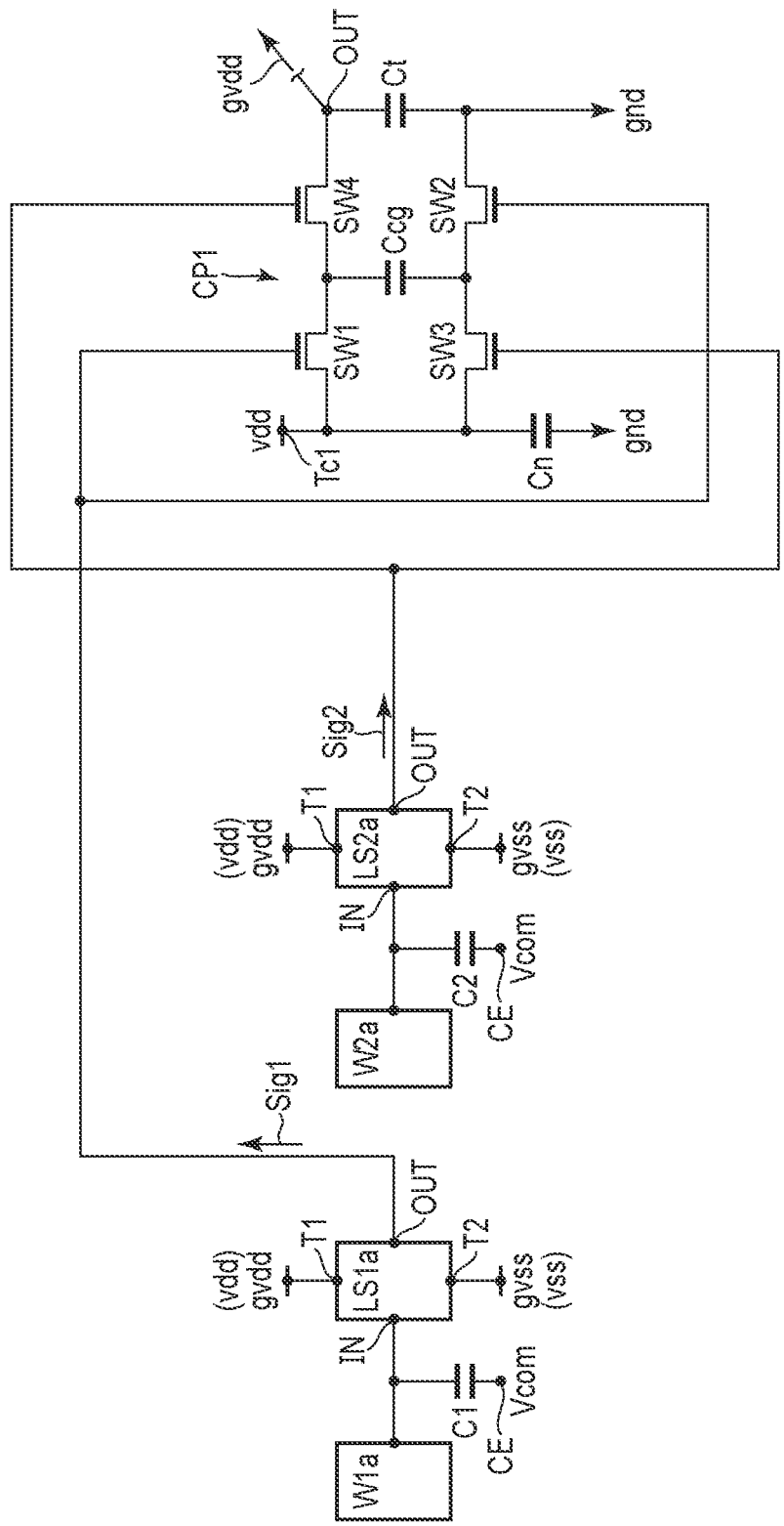
F I G. 18B

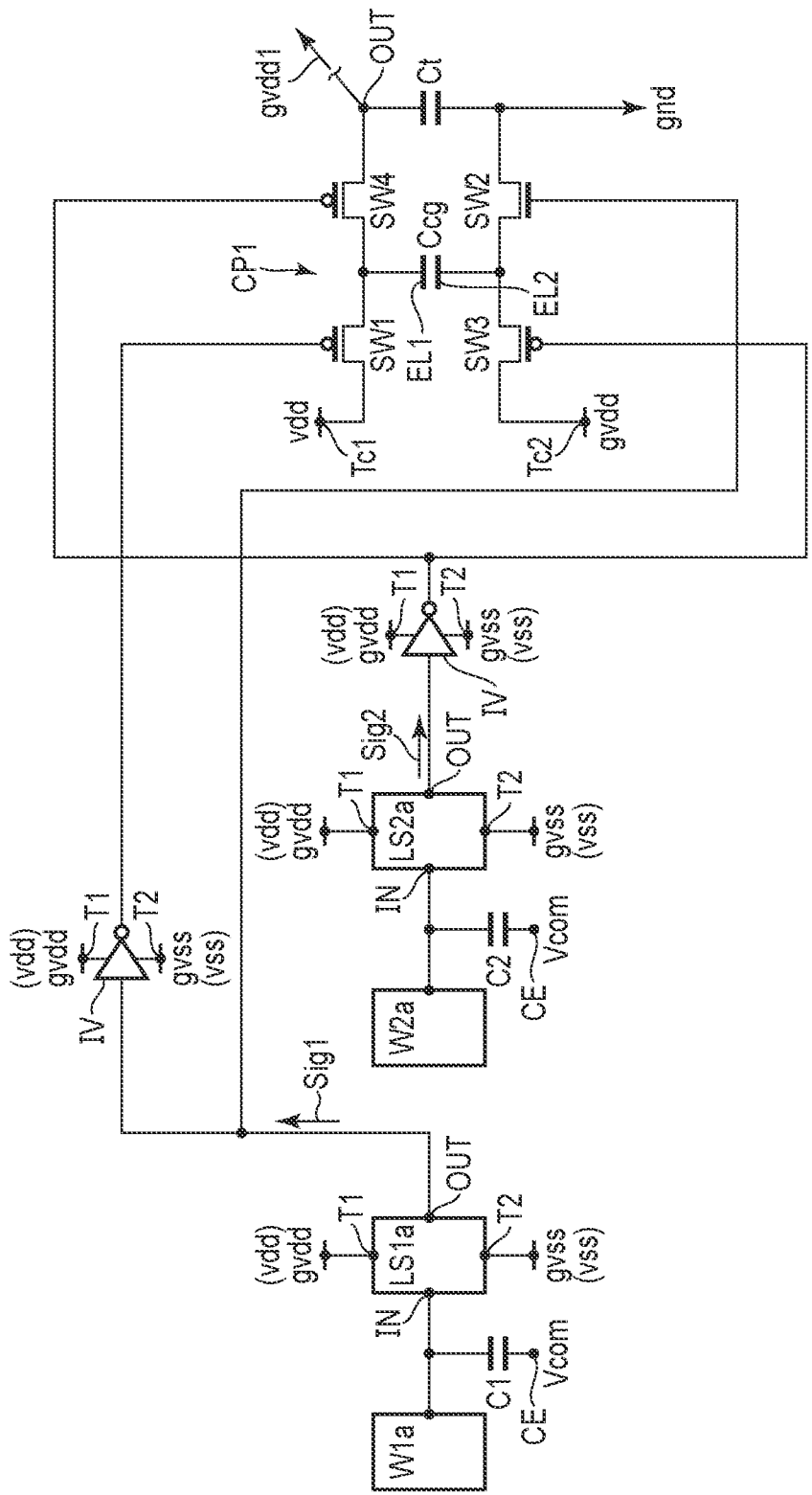
F I G. 18C

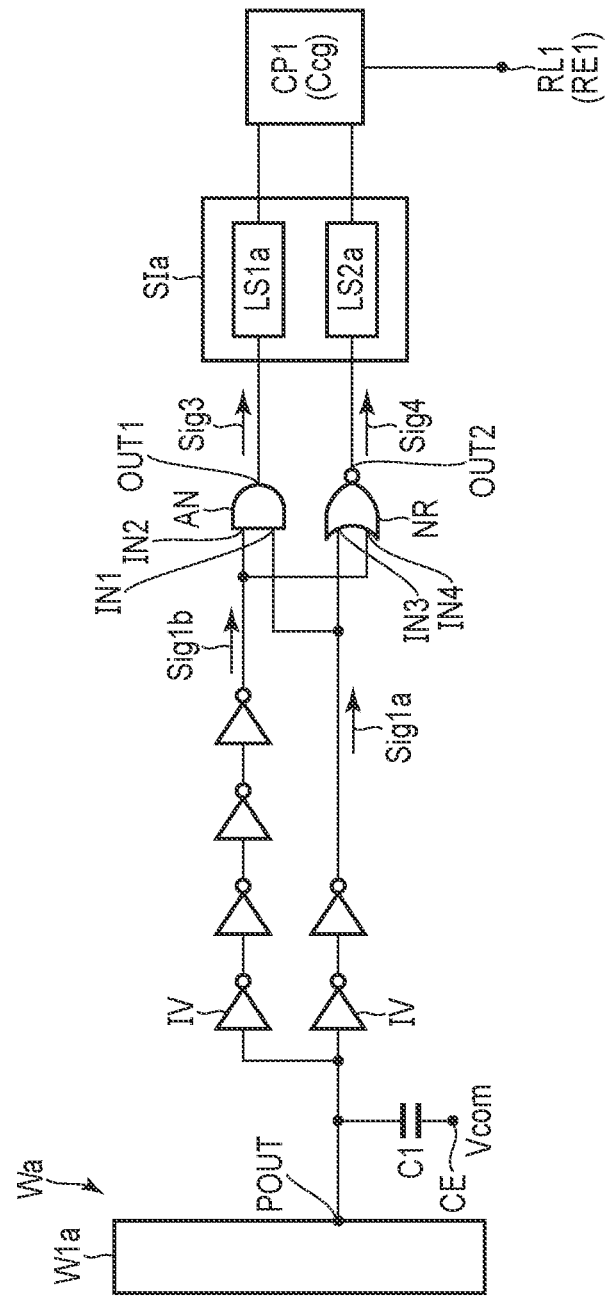
F I G. 19

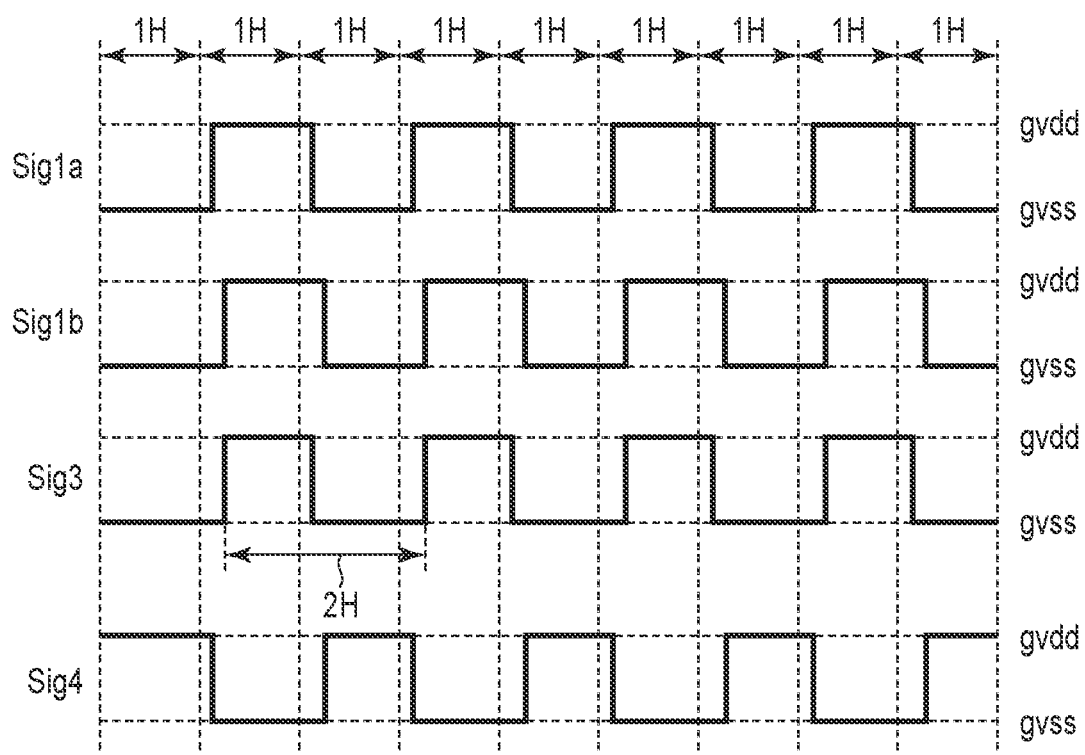
F I G. 20

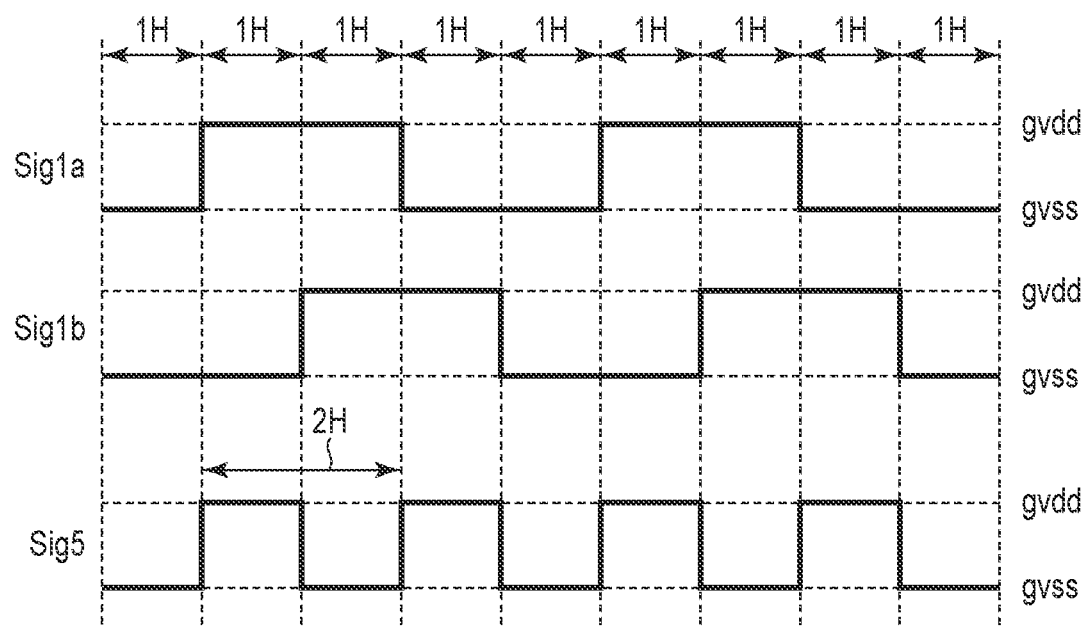
F I G. 22

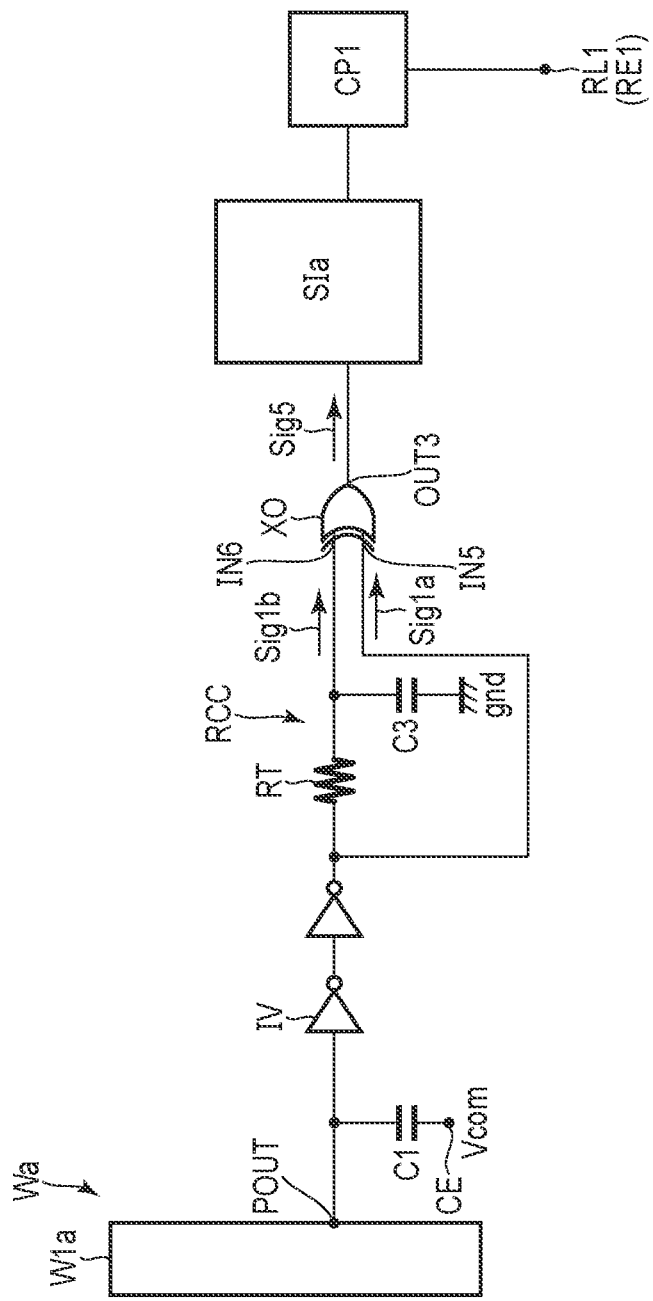
F I G. 23

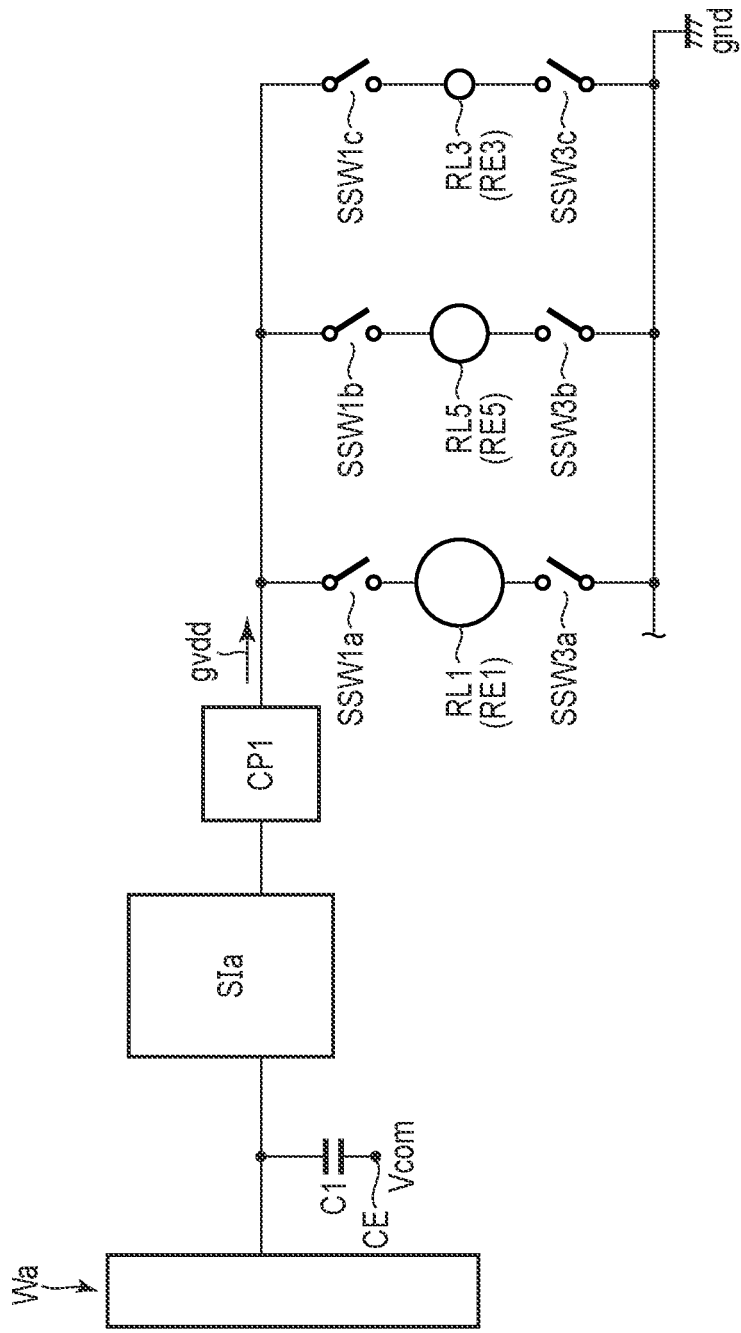
F I G. 24

DISPLAY PANEL AND ELECTRONIC DEVICE

CROSS-REFERENCE TO RELATED APPLICATIONS

This application is based upon and claims the benefit of priority from Japanese Patent Application No. 2021-106649, filed Jun. 28, 2021, the entire contents of which are incorporated herein by reference.

FIELD

Embodiments described herein relate generally to a display panel and an electronic device.

BACKGROUND

For example, liquid crystal display devices are known as display devices. The liquid crystal display device comprises a liquid crystal display panel as a display panel. The liquid crystal display panel comprises a plurality of pixels, a plurality of scanning lines, a plurality of signal lines, a signal line driving circuit connected to the plurality of signal lines, and the like. The plurality of pixels are provided in the display area. Each of the pixels comprises a thin-film transistor (TFT) and a pixel electrode connected to the TFT.

The signal line driving circuit is a driver IC composed of an integrated circuit (IC) chip. The signal line driving circuit outputs video signals to the signal lines. When the TFT is turned on in each of the pixels, the signal line driving circuit can write the video signals to the pixel electrodes via the signal lines and TFTs.

A control signal to activate the signal line driving circuit has a low voltage. For this reason, the signal line driving circuit outputs the video signals of a low voltage level to the signal lines, for example, video signals having a voltage value within a range of, for example, −5V to +5V to the signal lines. The plurality of pixels can be driven by polarity inversion drive and the liquid crystal display panel can perform multi-gradation display in the display area, by using the above-described signal line driving circuit.

In addition, the liquid crystal display panel may comprise electrodes other than the pixel electrodes, as disclosed in JP 2006-180033 A.

BRIEF DESCRIPTION OF THE DRAWINGS

FIG. 2 is a cross-sectional view showing a surrounding of a camera of the electronic device.

FIG. 11 is a view showing an equivalent circuit of a plurality of control switch groups, a plurality of level shift units, a plurality of charge pumps, a first control electrode structure, a plurality of scanning lines, and a plurality of signal lines of the liquid crystal display panel, together with a plurality of pixels, a scanning line driving circuit, and a signal line driving circuit.

FIG. 13 is a circuit diagram showing an electric system for generating a first output voltage, illustrating two control switches, two level shift circuits, one charge pump, and the like shown in FIG. 11.

FIG. 16 is a circuit diagram showing an electric system for generating a second output voltage, illustrating two control switches, two level shift circuits, one charge pump, and the like.

FIG. 18A is a circuit diagram showing a modified example 1 of the electric system shown in FIG. 13, illustrating two control switches, two level shift circuits, one charge pump, and the like.

FIG. 18B is a circuit diagram showing a modified example 2 of the electric system shown in FIG. 13, illustrating two control switches, two level shift circuits, one charge pump, and the like.

FIG. 18C is a circuit diagram showing a modified example 3 of the electric system shown in FIG. 13, illustrating two control switches, two level shift circuits, one charge pump, and the like.

FIG. 19 is a circuit diagram showing a part of an electronic device according to a second embodiment, together with an electric system for generating a first output voltage, illustrating one control switch, a plurality of inverters, one AND circuit, one NOR circuit, one level shift unit, one charge pump, and the like.

FIG. 20 is a timing chart showing a plurality of output signals shown in FIG. 19.

FIG. 21 is a circuit diagram showing a modified example 1 of a part of the electronic device according to the second embodiment, together with the electric system for generating the first output voltage, illustrating one control switch, a plurality of inverters, one exclusive-OR circuit, one level shift unit, one charge pump, and the like.

FIG. 22 is a timing chart showing a plurality of output signals shown in FIG. 21.

FIG. 23 is a circuit diagram showing a modified example 2 of a part of the electronic device according to the second embodiment, together with the electric system for generating the first output voltage, illustrating one control switch, a plurality of inverters, one RC circuit, one exclusive-OR circuit, one level shift unit, one charge pump, and the like.

FIG. 24 is a circuit diagram showing a part of an electronic device according to a third embodiment, illustrating one control switch group, one level shift unit, one charge pump, a first control electrode structure, a third control electrode structure, a fifth control electrode structure, a plurality of switches, and the like.

DETAILED DESCRIPTION

Figure 1:
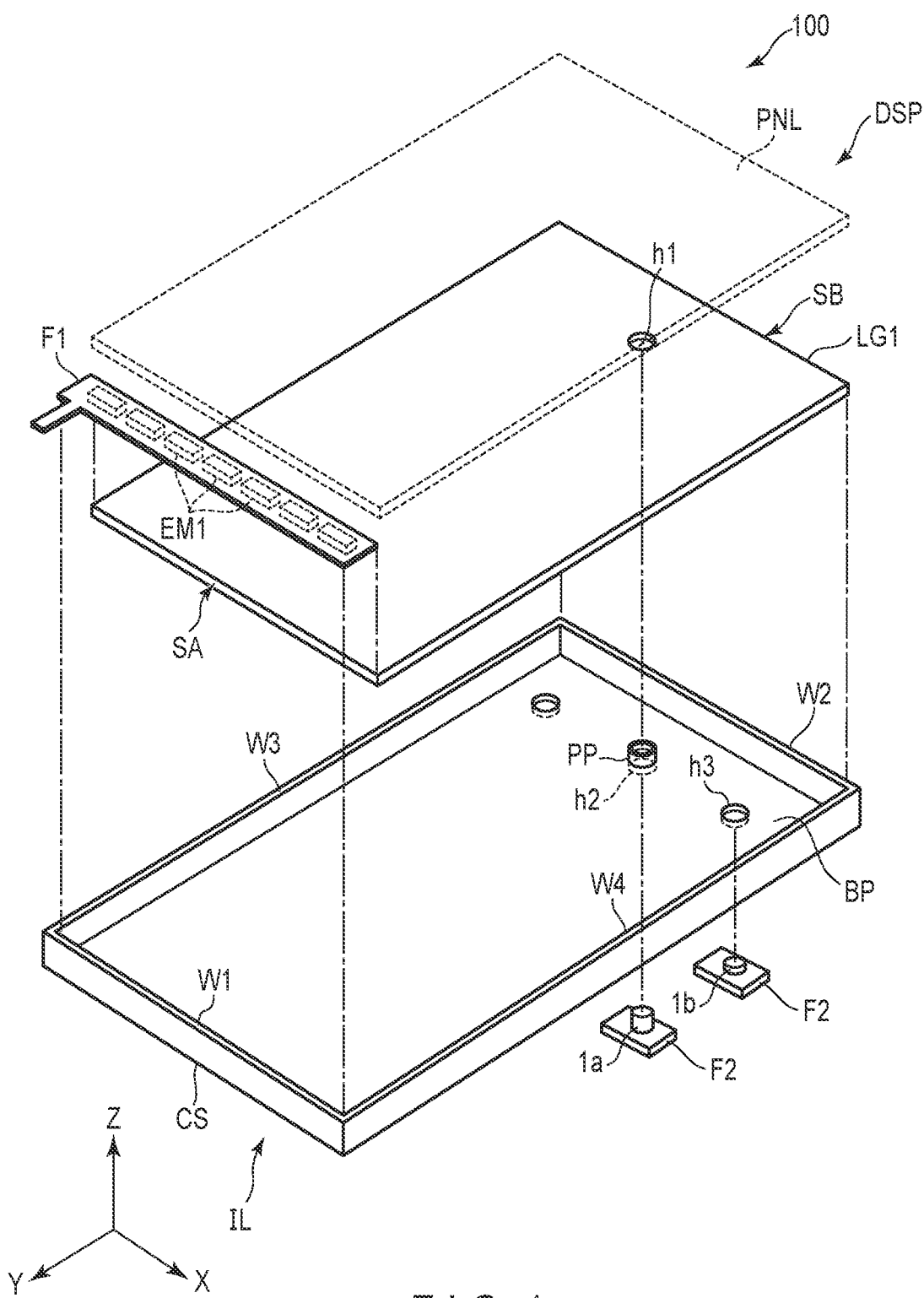
FIG. 1 is an exploded perspective view showing a configuration example of an electronic device according to a first embodiment.

In general, according to one embodiment, there is provided a display panel comprising: a plurality of scanning lines; a plurality of signal lines; a pixel switching element; a pixel electrode; and a first control switch including a plurality of first control switching elements, the pixel switching element being composed of a transistor and including a gate electrode electrically connected to a corresponding scanning line among the plurality of scanning lines, a source electrode electrically connected to a corresponding signal line among the plurality of signal lines, and a drain electrode electrically connected to the pixel electrode, each of the first control switching elements being composed of a transistor and including a gate electrode electrically connected to a corresponding scanning line among the plurality of scanning lines, a source electrode electrically connected to a corresponding signal line among the plurality of signal lines, and a drain electrode, the plurality of scanning lines electrically connected to the plurality of gate electrodes of the plurality of first control switching elements being different from each other, the drain electrodes of the plurality of first control switching elements being electrically bundled and connected to power source voltage output terminal of the first control switch.

According to another embodiment, there is provided an electronic device comprising: a display panel including a plurality of scanning lines, a plurality of signal lines, a pixel switching element, a pixel electrode, an incident light control area, a first control switch including a plurality of first control switching elements, a control electrode located in the incident light control area, a first level shift circuit, and a first charge pump; and an imaging device obtaining information of light transmitted through the incident light control area of the display panel, the pixel switching element being composed of a transistor and including a gate electrode electrically connected to a corresponding scanning line among the plurality of scanning lines, a source electrode electrically connected to a corresponding signal line among the plurality of signal lines, and a drain electrode electrically connected to the pixel electrode, each of the first control switching elements being composed of a transistor and including a gate electrode electrically connected to a corresponding scanning line among the plurality of scanning lines, a source electrode electrically connected to a corresponding signal line among the plurality of signal lines, and a drain electrode, the plurality of scanning lines electrically connected to the plurality of gate electrodes of the plurality of first control switching elements being different from each other, the plurality of drain electrodes of the plurality of first control switching elements being electrically bundled and connected to a power source voltage output terminal of the first control switch, the first control switch outputting a first power source voltage input from the signal line, to the power source voltage output terminal, the first level shift circuit outputting the first power source voltage to the first charge pump, the first charge pump generating a first output voltage and outputting the first output voltage to the control electrode, an absolute value of the first output voltage being larger than an absolute value of the first power source voltage.

Each of embodiments will be described hereinafter with reference to the accompanying drawings. The disclosure is merely an example, and proper changes in keeping with the spirit of the invention, which are easily conceivable by a person of ordinary skill in the art, come within the scope of the invention as a matter of course. In addition, in some cases, in order to make the description clearer, the widths, thicknesses, shapes and the like, of the respective parts are illustrated schematically in the drawings, rather than as an accurate representation of what is implemented. However, such schematic illustration is merely exemplary, and in no way restricts the interpretation of the invention. In addition, in the specification and drawings, the same elements as those described in connection with preceding drawings are denoted by like reference numbers, and detailed description thereof is omitted unless necessary.

First Embodiment

First, a first embodiment will be described. FIG. 1 is an exploded perspective view showing a configuration example of an electronic device 100 according to this embodiment.

As shown in FIG. 1, the direction X, the direction Y, and the direction Z are orthogonal to each other but may intersect at an angle other than 90 degrees.

The electronic device 100 comprises a liquid crystal display device DSP serving as a display device and a camera 1 serving as an imaging device. The liquid crystal display device DSP comprises a liquid crystal display panel PNL serving as a display panel and an illumination device (backlight) IL. The camera 1 includes a camera (camera module) 1a serving as a first camera. In this embodiment, all cameras 1b serving as second cameras are not shown in the figure, but the electronic device 100 further comprises two cameras 1b. The camera 1 may include the only camera 1a.

The illumination device IL comprises a light guide LG1, light source EM1, and a casing CS. The illumination device IL illuminates, for example, the liquid crystal display panel PNL simply represented by dashed lines in FIG. 1.

The light guide LG1 is formed in a flat panel shape parallel to an X-Y plane defined by the directions X and Y. The light guide LG1 is opposed to the liquid crystal display panel PNL. The light guide LG1 has a side surface SA, a side surface SB on the side opposite to the side surface SA, and a through hole h1 surrounding the camera 1a. The light guide LG1 is opposed to a plurality of cameras 1b. Each of the side surfaces SA and SB extends in the direction X. For example, the side surfaces SA and SB are planes parallel to an X-Z plane defined by the directions X and Z. The through hole h1 penetrates the light guide LG1 in the direction Z. The through hole h1 is located between the side surfaces SA and SB and is closer to the side surface SB than to the side surface SA, in the direction Y.

A plurality of light sources EM1 are aligned at intervals in the direction X. Each of the light sources EM1 is mounted on a wiring substrate F1 and is electrically connected to the wiring substrate F1. For example, the light source EM1 is a light-emitting diode (LED), which emits white illumination light. The illumination light emitted from the light source EM1 is made incident on the light guide LG1 from the side surface SA to travel inside the light guide LG1 from the side surface SA toward the side surface SB.

The light guide LG1 and the light source EM1 are accommodated in the casing CS. The casing CS has side walls W1 to W4, a bottom plate BP, a through hole h2, a protrusion PP, and a through holes h3. The side walls W1 and W2 extend in the direction X and are opposed in the direction Y. The side walls W3 and W4 extend in the direction Y and are opposed in the direction X. The through hole h2 overlap the through hole h1 in the direction Z. The protrusion PP is fixed to the bottom plate BP. The protrusion PP protrudes from the bottom plate BP toward the liquid crystal display panel PNL in the direction Z and surrounds the through hole h2.

In this embodiment, the casing CS includes two through holes h3 whose number is the same as the number of cameras 1b. The through holes h3 are formed to penetrate the bottom plate BP in the direction Z. The plurality of through holes h3 are provided to be dispersed together with the through hole h2 in planar view. In addition, when the bottom plate BP is formed of a material that allows infrared light to be transmitted, the through holes h3 do not need to be formed in the bottom plate BP. Otherwise, it is desirable to form the through holes h3 in the bottom plate BP and surround the cameras 1b with the through holes h3, from the viewpoint of reducing the thickness of the electronic device 100 in the direction Z.

The light guide LG1 overlaps the liquid crystal display panel PNL.

The cameras 1a and 1b are mounted on the wiring substrates F2 and electrically connected to the wiring substrates F2. The camera 1a is opposed to the liquid crystal display panel PNL through the through hole h2, the inside of the protrusion PP, and the through hole h1. The cameras 1b are opposed to the light guide LG1 through the through holes h3.

FIG. 2 is a cross-sectional view showing a surrounding of the camera 1a of the electronic device 100.

As shown in FIG. 2, the illumination device IL further comprises a light reflective sheet RS, a light diffusion sheet SS, and prism sheets PS1 and PS2.

The light reflective sheet RS, the light guide LG1, the light diffusion sheet SS, the prism sheet PS1, and the prism sheet PS2 are arranged in this order in the direction Z and are accommodated in the casing CS. The casing CS comprises a metallic casing CS1 and a light-shielding wall CS2 formed of resin which serves as a peripheral member. The light-shielding wall CS2 is adjacent to the camera 1 to form the protrusion PP together with the casing CS1. The light-shielding wall CS2 is located between the camera 1 and the light guide LG1 and has a cylindrical shape. The light-shielding wall CS2 is formed of resin such as black resin, which absorbs light. Each of the light diffusion sheet SS, the prism sheet PS1, and the prism sheet PS2 has a through hole which overlaps the through hole h1. The protrusion PP is located inside the through hole h1.

The liquid crystal display panel PNL further comprises a polarizer PL1 and a polarizer PL2. The liquid crystal display panel PNL and a cover glass CG serving as a cover member are arranged in the direction Z and constitute a liquid crystal element LCD comprising an optical switch function for the light traveling in the direction Z. The liquid crystal element LCD is stuck to the illumination device IL by an adhesive tape TP1. The adhesive tape TP1 is stuck to the protrusion PP, the prism sheet PS2, and the polarizer PL1.

The liquid crystal display panel PNL may comprise a configuration corresponding to any one of a display mode using a lateral electric field along the main surface of the substrate, a display mode using a longitudinal electric field along the normal of the main surface of the substrate, a display mode using an inclined electric field which is tilted obliquely with respect to the main surface of the substrate, and a display mode using an appropriate combination of the above lateral electric field, longitudinal electric field, and inclined electric field. The main surface of the substrate is a surface parallel to the X-Y plane.

The liquid crystal display panel PNL comprises a display area DA where an image is displayed, a non-display area NDA located outside the display area DA, and an incident light control area PCA surrounded by the display area DA and having a circular shape. The liquid crystal display panel PNL comprises a first substrate SUB1, a second substrate SUB2, a liquid crystal layer LC, and a sealant SE. The sealant SE is located in the non-display area NDA to bond the first substrate SUB1 to the second substrate SUB2. The liquid crystal layer LC is located in the display area DA and the incident light control area PCA and is held between the first substrate SUB1 and the second substrate SUB2. The liquid crystal layer LC is formed in a space surrounded by the first substrate SUB1, the second substrate SUB2 and the sealant SE.

An image is displayed on the display area DA by controlling the quantity of transmitted light emitted from the illumination device IL by the liquid crystal display panel PNL. The user of the electronic device 100 is located on the direction Z side of the cover glass CG (i.e., an upper side in the figure) and observes the light emitted from the liquid crystal display panel PNL as an image.

In contrast, the quantity of the transmitted light is also controlled by the liquid crystal display panel PNL in the incident light control area PCA, and the light is made incident on the camera 1 from the direction Z side of the cover glass CG through the liquid crystal display panel PNL.

In the present specification, the light traveling from the illumination device IL to the cover glass CG side through the liquid crystal display panel PNL is referred to as emitted light, and the light traveling from the cover glass CG side to the camera 1 through the liquid crystal display panel PNL is referred to as incident light.

Main parts of the first substrate SUB1 and the second substrate SUB2 will be hereinafter described.

The first substrate SUB1 comprises an insulating substrate 10 and an alignment film AL1. The second substrate SUB2 comprises an insulating substrate 20, a color filter CF, a light-shielding layer BM, a transparent layer OC, and an alignment film AL2.

The insulating substrate 10 and the insulating substrate 20 are transparent substrates such as glass substrates or flexible resin substrates. The alignment films AL1 and AL2 are in contact with the liquid crystal layer LC.

The color filter CF, the light-shielding layer BM, and the transparent layer OC are located between the insulating substrate 20 and the liquid crystal layer LC. In the example illustrated, the color filter CF is provided on the second substrate SUB2, but may be provided on the first substrate SUB1. The color filter CF is located in the display area DA.

The incident light control area PCA includes at least a first light-shielding area LSA1 located in the outermost periphery and having an annular shape, and a first incident light adjustment area TA1 surrounded by the first light-shielding area LSA1 and being in contact with the first light-shielding area LSA1.

The light-shielding layer BM includes a light-shielding portion located in the display area DA to partition pixels and a frame-shaped light-shielding portion BMB located in the non-display portion NDA. In the incident light control area PCA, the light-shielding layer BM includes at least a first light-shielding portion BM1 located in the first light-shielding area LSA1 and having an annular shape, and a first opening OP1 located in the first incident light adjustment area TA1.

A boundary of the display area DA and the non-display area NDA is defined by, for example, an inner end of the light-shielding portion BMB (i.e., an end part of the display area DA side). The sealant SE overlaps the light-shielding portion BMB.

The transparent layer OC is in contact with the color filter CF in the display area DA, with the light-shielding portion BMB in the non-display area NDA, with the first light-shielding portion BM1 in the first light-shielding area LSA1, and with the insulating substrate 20 in the first incident light adjustment area TA1. The alignment film AL1 and the alignment film AL2 are provided across the display area DA, the incident light control area PCA, and the non-display area NDA.

The detailed descriptions of the color filter CF are omitted here, but the color filter CF comprises, for example, a red colored layer arranged at a red pixel, a green colored layer arranged at a green pixel, and a blue colored layer arranged at a blue pixel. In addition, the color filter CF often comprises a transparent resin layer arranged at a white pixel. The transparent layer OC covers the color filter CF and the light-shielding layer BM. For example, the transparent layer OC is a transparent organic insulating layer.

The camera 1 is located inside the through hole h2 of the casing CS. The camera 1 overlaps the cover glass CG and the liquid crystal display panel PNL in the direction Z. The liquid crystal display panel PNL may further comprise an optical sheet other than the polarizers PL1 and PL2, in the incident light control area PCA. A retardation film, a light scattering layer, an anti-reflective layer or the like can be used as the optical sheet. In the electronic device 100 comprising the liquid crystal display panel PNL, the camera 1a, and the like, the camera 1a is provided on a back side of the liquid crystal display panel PNL as viewed from the user of the electronic device 100.

For example, the camera 1a comprises an optical system 2 including at least one lens, an imaging device (image sensor) 3, and a casing 4. The imaging device 3 includes an imaging surface 3a which faces the liquid crystal display panel PNL side. The optical system 2 is opposed to the incident light control area PCA of the liquid crystal display panel PNL. The optical system 2 is located between the imaging surface 3a and the liquid crystal display panel PNL, and includes a light-entering surface 2a which faces the liquid crystal display panel PNL side. The light-entering surface 2a overlaps the incident light control area PCA. The optical system 2 is located to be spaced apart from the liquid crystal display panel PNL. The casing 4 accommodates the optical system 2 and the imaging device 3.

A light source EM2 serving as a first light source and a light source EM3 serving as a second light source are arranged in the upper part of the casing 4. The light source EM2 is configured to emit infrared light to the liquid crystal display panel PNL side. The light source EM3 is configured to emit visible light to the liquid crystal display panel PNL side. The light sources EM2 and EM3 are provided for the purpose of illuminating a subject to be captured by the camera 1a.

The camera 1a obtains information of the light transmitted through the incident light control area PCA of the liquid crystal display panel PNL. The imaging device 3 of the camera 1a receives light through the cover glass CG, the liquid crystal display panel PNL, and the optical system 2. The imaging device 3 is configured to convert the light transmitted through the incident light control area PCA of the liquid crystal display panel PNL, the optical system 2, and the like into image data. For example, the camera 1a receives visible light (for example, light having a wavelength range of 400 nm to 700 nm) transmitted through the cover glass CG and the liquid crystal display panel PNL. In addition, the camera can also receive infrared light (for example, light having a wavelength range of 800 nm to 1500 nm) as well as visible light.

Incidentally, the cameras 1b are different from the camera 1a in that they do not include the light sources EM3. The cameras 1b are opposed to the light reflecting sheet RS through the through holes h3 (FIG. 1). The cameras 1b can receive infrared light through the cover glass CG, the liquid crystal display panel PNL, the prism sheet PS2, the prism sheet PS1, the light diffusing sheet SS, the light guide LG1, the light reflective sheet RS, and the optical system 2. The light reflective sheet RS has a hole in the light reflective sheet at the position where it overlaps an IR sensor. However, when the light reflecting sheet is thin enough to allow IR transmission, the light reflecting sheet does not need to include a hole, and infrared light transmitted through the light reflecting sheet may be received by the IR sensor. In this case, the adverse effect on the visibility of the image can be reduced. In addition, the camera 1b can be accommodated in the through hole h1 of the light guide LG1 and the through hole h2 of the bottom plate BP, similarly to the camera 1a.

The polarizer PL1 is bonded to the insulating substrate 10. The polarizer PL2 is bonded to the insulating substrate 20. The cover glass CG is stuck to the polarizer PL2 by a transparent adhesive layer AD.

In addition, a transparent conductive layer may be provided between the polarizer PL2 and the insulating substrate 20 to prevent the liquid crystal layer LC from being influenced from an electric field from the outside, and the like. The transparent conductive layer is formed of a transparent conductive material such as indium tin oxide (ITO) or indium zinc oxide (IZO).

In addition, an ultra-birefringent film can be included in the polarizer PL1 or PL2. It is known that the ultra-birefringent film makes the transmitted light non-polarized (change to natural light) when linearly polarized light is made incident, and a subject can be captured without uncomfortable feeling even if the subject includes an element which emits polarized light. For example, when an electronic device 100 or the like is reflected in the subject of the camera 1a, the luminance of the electronic device 100 in the subject made incident on the camera 1a may be varied due to a relationship between the polarizers PL1 and PL2, and the angle made between the electronic device 100 which is the subject and the polarizers, and an uncomfortable feeling may be made at imaging, since the linearly polarized light is emitted from the electronic device 100. However, the variation in the luminance that causes the uncomfortable feeling can be suppressed by providing the ultra-birefringent films in the polarizers PL1 and PL2.

As a film exhibiting the ultra-birefringence, for example, COSMOSHINE (registered trademark) manufactured by TOYOBO CO., LTD., is desirably used. The ultra-birefringence means that the retardation in the in-plane direction with respect to light in the visible region, for example, 500 nm is 800 nm or more.

The liquid crystal display panel PNL has a first surface S1 on the image display side and a second surface S2 on the side opposite to the first surface S1. In this embodiment, the polarizing plate PL2 has the first surface S1, and the polarizing plate PL1 has the second surface S2.

The light sources EM2 and EM3 are located on the second surface S2 side of the liquid crystal display panel PNL.

The display area DA and the incident light control area PCA are the areas overlapping the first substrate SUB1, the second substrate SUB2, and the liquid crystal layer LC, respectively.

Figure 3:
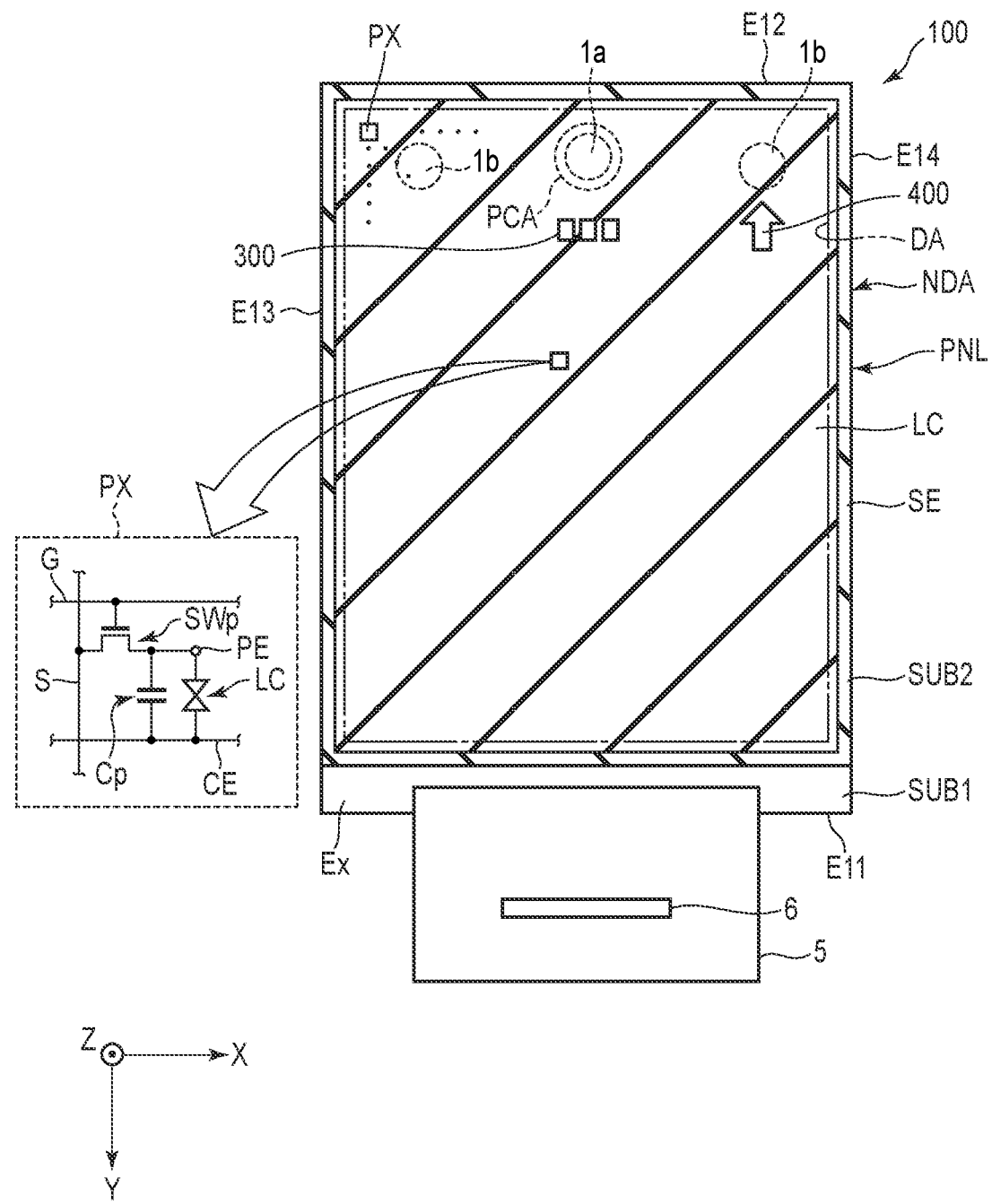
FIG. 3 is a plan view showing arrangement and the like of the liquid crystal display panel shown in FIG. 2 and a plurality of cameras together with an equivalent circuit of one pixel.

FIG. 3 is a plan view showing arrangement of the liquid crystal display panel PNL and the plurality of cameras 1a and 1b shown in FIG. 2, and the like, together with an equivalent circuit of one pixel PX. In FIG. 3, the liquid crystal layer LC and the sealant SE are represented by different hatch lines.

As shown in FIG. 3, the display area DA is a substantially quadrangular area, but may be rounded at four corners or may be shaped in a polygon other than a quadrangular or a circle. The display area DA is surrounded by the sealant SE.

The liquid crystal display panel PNL has a pair of shorter sides E11 and E12 extending in the direction X and a pair of longer sides E13 and E14 extending in the direction Y. The liquid crystal display panel PNL comprises a plurality of pixels PX arrayed in a matrix in the direction X and the direction Y, in the display area DA. The pixels PX in the display area DA have the same circuit configuration. As shown and enlarged in FIG. 3, each pixel PX comprises a pixel switching element SWp, a pixel electrode PE, a common electrode CE, a liquid crystal layer LC and the like.

The pixel switching element SWp is composed of, for example, a thin-film transistor (TFT). The pixel switching element SWp includes a gate electrode electrically connected to a corresponding scanning line G among a plurality of scanning lines G, a source electrode electrically connected to a corresponding signal line S among a plurality of signal lines S, and a drain electrode electrically connected to the pixel electrode PE. A control signal to control the pixel switching element SWp is supplied to the scanning line G. An image signal such as a video signal is supplied to the signal line S as a signal different from the control signal. A common voltage is supplied to the common electrode CE. The liquid crystal layer LC is driven with a voltage (electric field) generated between the pixel electrode PE and the common electrode CE. For example, a capacitor Cp is formed between an electrode having the same potential as the common electrode CE and an electrode having the same potential as the pixel electrode PE.

The electronic device 100 further comprises a wiring substrate 5 and an IC chip 6.

The wiring substrate 5 is mounted on an extending portion Ex of the first substrate SUB1 and is coupled to the extending portion Ex. The IC chip 6 is mounted on the wiring substrate 5 and is electrically connected to the wiring substrate 5. Incidentally, the IC chip 6 may be mounted on the extending portion Ex and electrically connected to the extending portion Ex. The IC chip 6 incorporates, for example, a display driver which outputs a signal necessary for image display, and the like. The wiring substrate 5 may be a foldable flexible printed circuit.

In FIG. 3, the electronic device 100 comprises three cameras 1 in the display area DA. Among them, the incident light control area PCA is formed to overlap the camera 1a in the upper center of the figure. Incidentally, the incident light control area PCA includes an outer periphery adjacent to the display area DA. Normal pixels PX overlap other cameras 1b, and normal display is performed in pixels PX overlapping the cameras 1b.

Since the polarizer PL1 and the polarizer PL2 have high transmittance in the infrared light wavelength range and allow infrared light to be transmitted, infrared light can be received by the cameras 1a and 1b even if the pixels PX overlap the cameras 1a and 1b. The user can use the electronic device 100 without being aware of the positions of the cameras 1b by executing normal display at the pixels PX that overlap the cameras 1b. In addition, since the area of the display area DA is not reduced, a large number of cameras 1b can be arranged. In addition, the user is not made aware of the fact that a large number of cameras 1b are arranged. In particular, when the electronic device 100 is used in an automatic teller machine (ATM) or the like, recognizing the presence of the cameras 1b can be made more difficult for the user by arranging the cameras 1b at parts fixed to the black display.

Reference numeral 300 denotes an indicator, which can intuitively notify the user of the states of the cameras 1a and 1b. For example, in the fingerprint authentication or the like, the user can be notified of an optimum position of the finger by the indicator 300. In addition, arrow 400 indicates a mark that is displayed when the user dares to be notified of the position of the camera 1b. The displayed figure is not limited to the arrow 400, but an appropriate shape, which surrounds a periphery of the camera 1b in a circular shape, can be selected.

Figure 4:
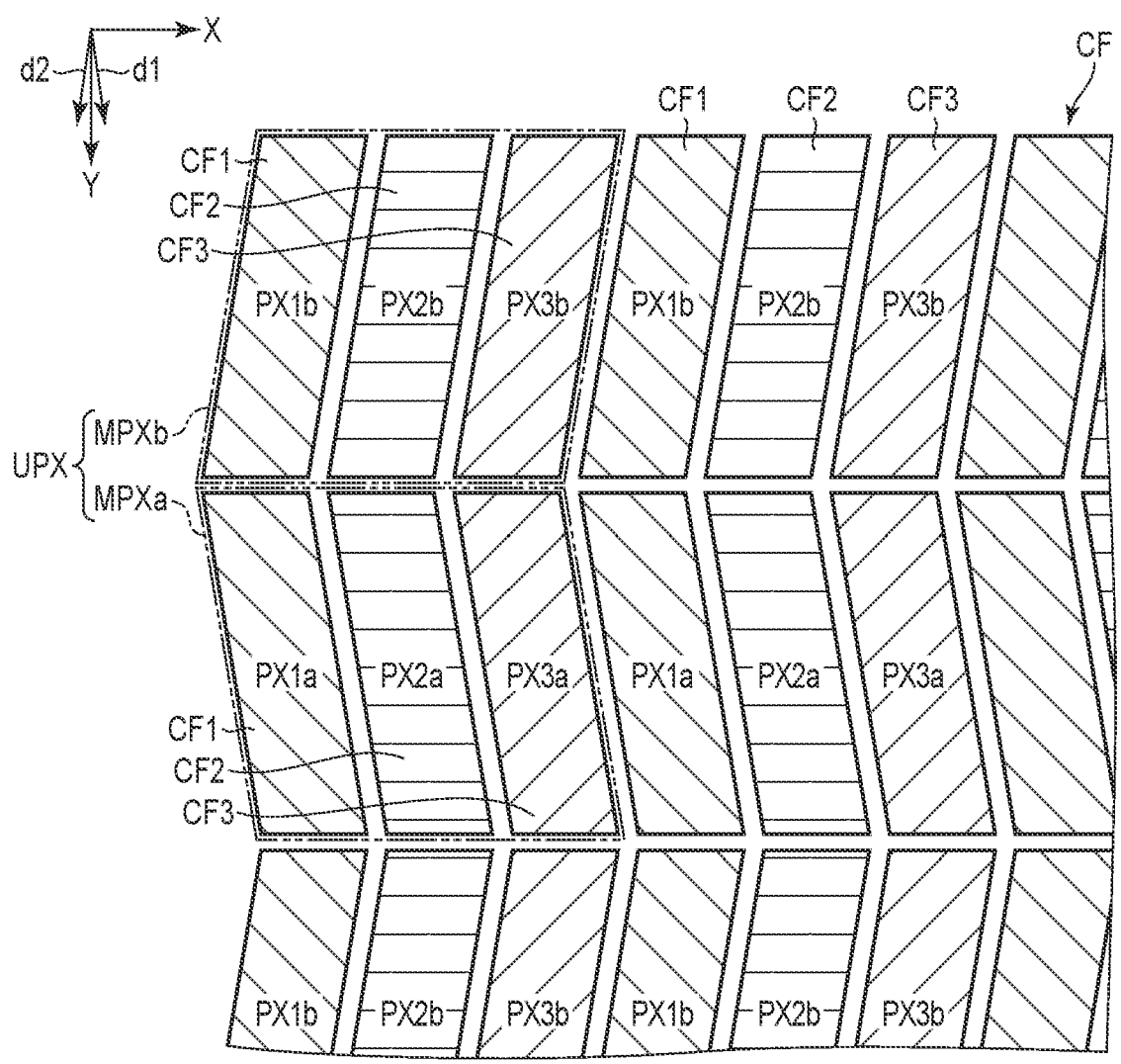
FIG. 4 is a plan view showing a pixel array on the liquid crystal display panel.

FIG. 4 is a plan view showing the array of the pixels PX on the liquid crystal display panel PNL.

As shown in FIG. 4, each of main pixels MPX is composed of a plurality of pixels PX. A plurality of main pixels MPX are classified into two types of main pixels MPXa and MPXb. Two main pixels MPXa and MPXb adjacent in the direction Y constitute a unit pixel UPX. Each of the main pixels MPXa and MPXb corresponds to a minimum unit of display of a color image. The main pixel MPXa includes pixels PX1a, PX2a, and PX3a. The main pixel MPXb includes pixels PX1b, PX2b, and PX3b. In addition, the shape of the above pixel PX is an approximate parallelogram as shown in the figure.

Each of the main pixels MPXa and MPXb includes multicolor pixels PX which are arranged in the direction X. The pixels PX1a and PX1b are first color pixels and comprise colored layers CF1 of the first color. The pixels PX2a and PX2b are second color pixels different from the first color pixel and comprise colored layers CF2 of the second color. The pixels PX3a and PX3b are third color pixels different from the first color pixel and second color pixel, and comprise colored layers CF3 of the third color.

The main pixels MPXa and the main pixels MPXb are repeatedly arranged in the direction X. Rows of the main pixels MPXa arranged in the direction X and rows of main pixels MPXb arranged in the direction X are arranged alternately and repeatedly in the direction Y. Each pixel PX of the main pixel MPXa extends in a first extending direction d1, and each pixel PX of the main pixel MPXb extends in a second extending direction d2. Incidentally, the first extending direction d1 is a direction different from the directions X and Y. The second extending direction d2 is a direction different from the directions X and Y and the first extending direction d1. In the example shown in FIG. 5, the first extending direction d1 is a right downward direction, and the second extending direction d2 is a left downward direction.

When the shape of the pixel PX is an approximate parallelogram as shown in the figure, a plurality of domains different in direction of rotation of the director can be set in the unit pixel UPX. In other words, it is possible to form a number of domains with respect to the pixel of each color and compensate for the property of viewing angle by combining two main pixels MPXa and MPXb. For this reason, when the property of viewing angle is focused, one unit pixel UPX obtained by combining the main pixels MPXa and MPXb corresponds to the minimum unit for displaying a color image.

Figure 5:
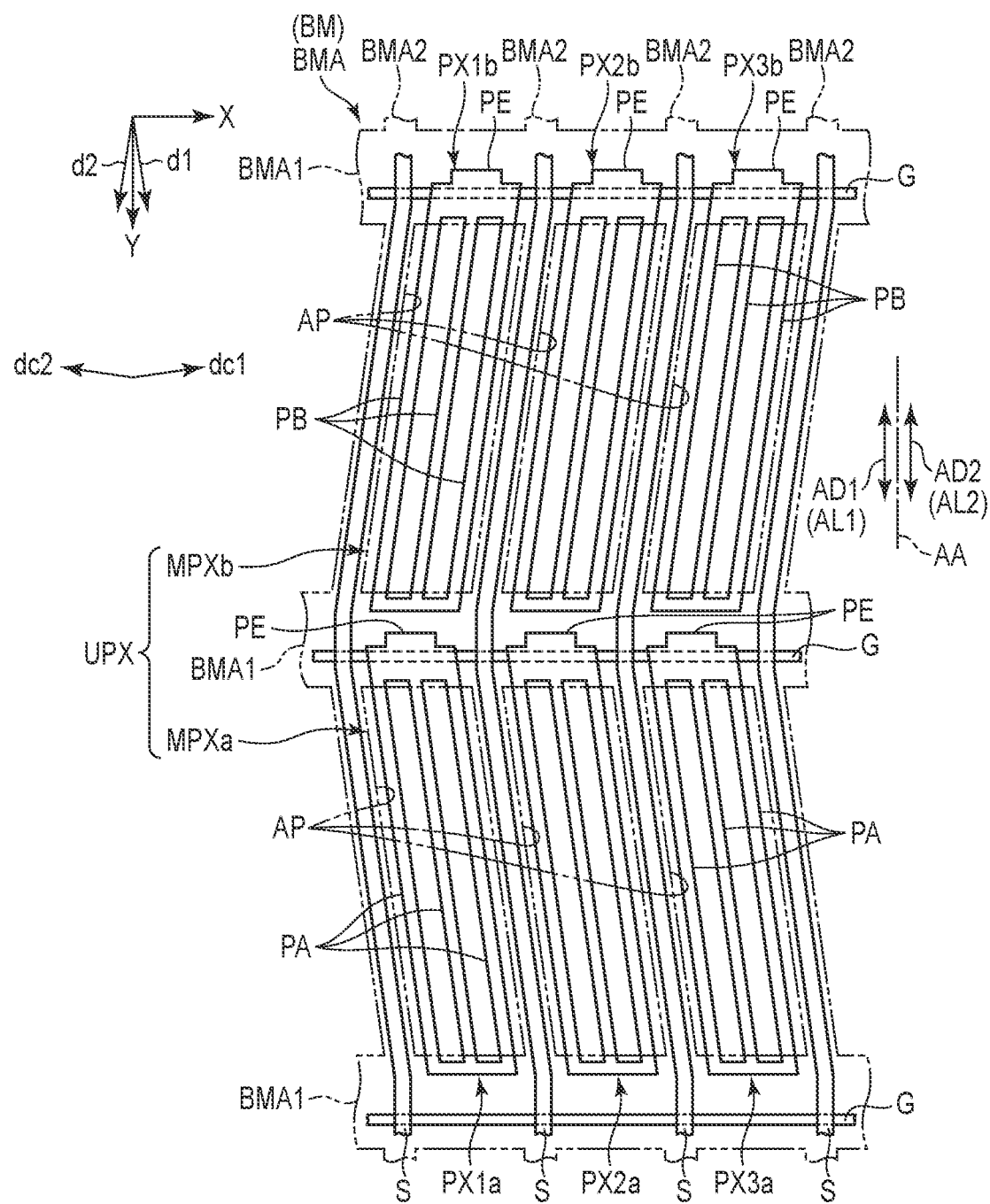
FIG. 5 is a plan view showing a unit pixel of the liquid crystal display panel, illustrating scanning lines, signal lines, pixel electrodes, and a light-shielding portion.

FIG. 5 is a plan view showing one unit pixel UPX of the liquid crystal display panel PNL, illustrating the scanning lines G, the signal lines S, the pixel electrodes PE, and a light-shielding portion BMA. Incidentally, in FIG. 5, only constituent elements necessary for descriptions are illustrated, but illustration of the pixel switching element SWp, the common electrode CE, color filter CF, and the like is omitted.

As shown in FIG. 5, the plurality of pixels PX have a configuration conforming to a fringe field switching (FFS) mode, which is one of the display modes using the lateral electric field. The scanning lines G and the signal lines S are arranged on the first substrate SUB1 whereas the light-shielding portion BMA (light-shielding layer BM) is arranged on the second substrate SUB2. The scanning lines G and the signal lines S cross each other and cause the display area (DA) to extend. A plurality of scanning lines G extend in the direction X and are arranged in the direction Y. A plurality of signal lines S extend in the direction Y and are arranged in the direction X. Incidentally, the light-shielding portion BMA is a grating-shaped light-shielding portion located in the display area DA to partition the pixels PX, and is represented by two-dot chain lines in the figure.

The light-shielding portion BMA comprises at least a function of blocking light emitted from the above-explained illumination device (IL). The light-shielding portion BMA is formed of a material having a high light absorption index such as black resin. The light-shielding portion BMA is formed in a grating shape. A plurality of light-shielding portion BMA1 extending in the direction X and a plurality of light-shielding portion BMA2 extending while bending in the first extending direction d1 and the second extending direction d2 are integrated to form the light-shielding portion BMA.

Each of the scanning lines G extends in the direction X. Each of the scanning lines G is opposed to the corresponding light-shielding portion BMA1 and extends along the corresponding light-shielding portion BMA1. The light-shielding portion BMA1 is opposed to the scanning lines G, end parts of the pixel electrodes PE, and the like. Each of the signal lines S extends while bending in the direction Y, the first extending direction d1, and the second extending direction d2. Each of the signal lines S is opposed to the corresponding light-shielding portion BMA2 and extends along the corresponding light-shielding portion BMA2.

The light-shielding layer BM includes a plurality of opening areas AP. The opening areas AP are partitioned by the light-shielding portions BMA1 and the light-shielding portions BMA2. The opening area AP of the main pixel MPXa extends in the first extending direction d1. The opening area AP of the main pixel MPXb extends in the second extending direction d2.

The pixel electrode PE of the main pixel MPXa includes a plurality of linear pixel electrodes PA located in the opening area AP. The plurality of linear pixel electrodes PA extend linearly in the first extending direction d1, and are arranged and spaced apart in an orthogonal direction dc1 that is orthogonal to the first extending direction d1. The pixel electrode PE of the main pixel MPXb includes a plurality of linear pixel electrodes PB located in the opening area AP. The plurality of linear pixel electrodes PB extend linearly in the second extending direction d2, and are arranged and spaced apart in an orthogonal direction dc2 that is orthogonal to the second extending direction d2.

In the display area DA, the above-described alignment films AL1 and AL2 have an alignment axis AA parallel to the direction Y. An alignment direction AD1 of the alignment film AL1 is parallel to the direction Y, and an alignment direction AD2 of the alignment film AL2 is parallel to the alignment direction AD1.

When a voltage is applied to the liquid crystal layer (LC), a rotated state (aligned state) of liquid crystal molecules in the opening areas AP of the main pixel MPXa is different from a rotated state (aligned state) of liquid crystal molecules in the opening areas AP of the main pixel MPXb. For this reason, it is possible to compensate for the viewing angle characteristics.

Figure 6:
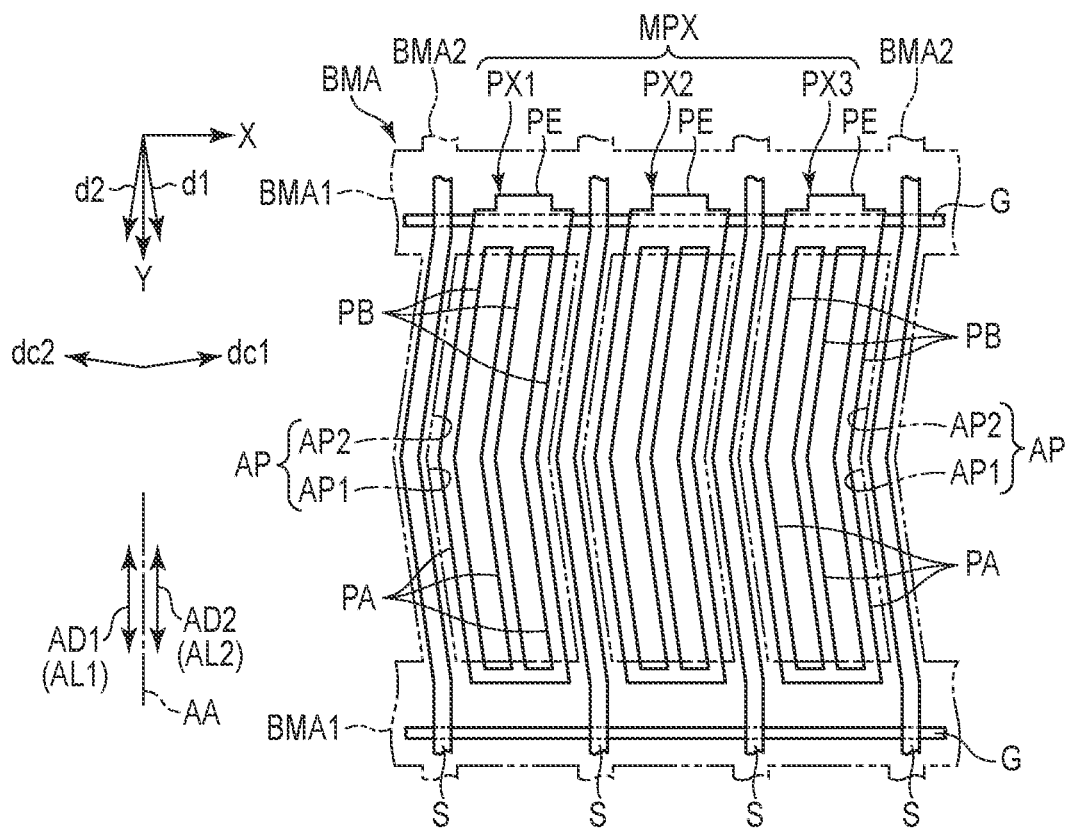
FIG. 6 is a plan view showing a main pixel different from the embodiment, illustrating scanning lines, signal lines, pixel electrodes, and a light-shielding portion.

As described above, the structure of compensating for the property of viewing angle by one unit pixel UPX has been described with reference to FIG. 4 and FIG. 5. Unlike this embodiment, however, the configuration may compensate for the viewing angle characteristics by one main pixel MPX. FIG. 6 is a plan view showing a main pixel MPX different from that of this embodiment, illustrating the scanning lines G, the signal lines S, the pixel electrodes PE, and the light-shielding portions BMA.

As shown in FIG. 6, each of the opening areas AP extends in the second extending direction d2, bends in the middle part, and extends in the first extending direction d1. Each of the opening areas AP is shaped in a symbol < and includes a first opening area AP1 and a second opening area AP2. The first opening area AP1 extends in the first extending direction d1, and the second opening area AP2 extends in the second extending direction d2.

The pixel electrode PE extends in the second extending direction d2, bends in the middle part, and extends in the first extending direction d1. The pixel electrode PE comprises a plurality of linear pixel electrodes PA and a plurality of linear pixel electrodes PB. A plurality of linear pixel electrodes PA are located in the first opening areas AP1, extend linearly in the first extending direction d1, and are arranged and spaced apart in the orthogonal direction dc1. A plurality of linear pixel electrodes PB are located in the second opening areas AP2, extend linearly in the second extending direction d2, and are arranged and spaced apart in the orthogonal direction dc2. One linear pixel electrode PA and one linear pixel electrode PB that are formed sequentially are shaped in a symbol <.

In planar view in which the pixel PX1 is located on the left side and the pixel PX3 is located on the right side, one linear pixel electrode PA and one linear pixel electrode PB formed sequentially may be shaped in a symbol > and the opening area AP may be shaped in a symbol >.

When a voltage is applied to the liquid crystal layer (LC), a rotated state of liquid crystal molecules in the first opening areas AP1 is different from a rotated state of liquid crystal molecules in the second opening areas AP2. Each opening area AP has four domains different in rotational direction of the director. For this reason, the liquid crystal display panel PNL can obtain desirable viewing angle characteristics.

Incidentally, in the first embodiment, the pixel electrodes PE function as display electrodes, and the linear pixel electrodes PA and the linear pixel electrodes PB function as linear display electrodes.

Figure 7:
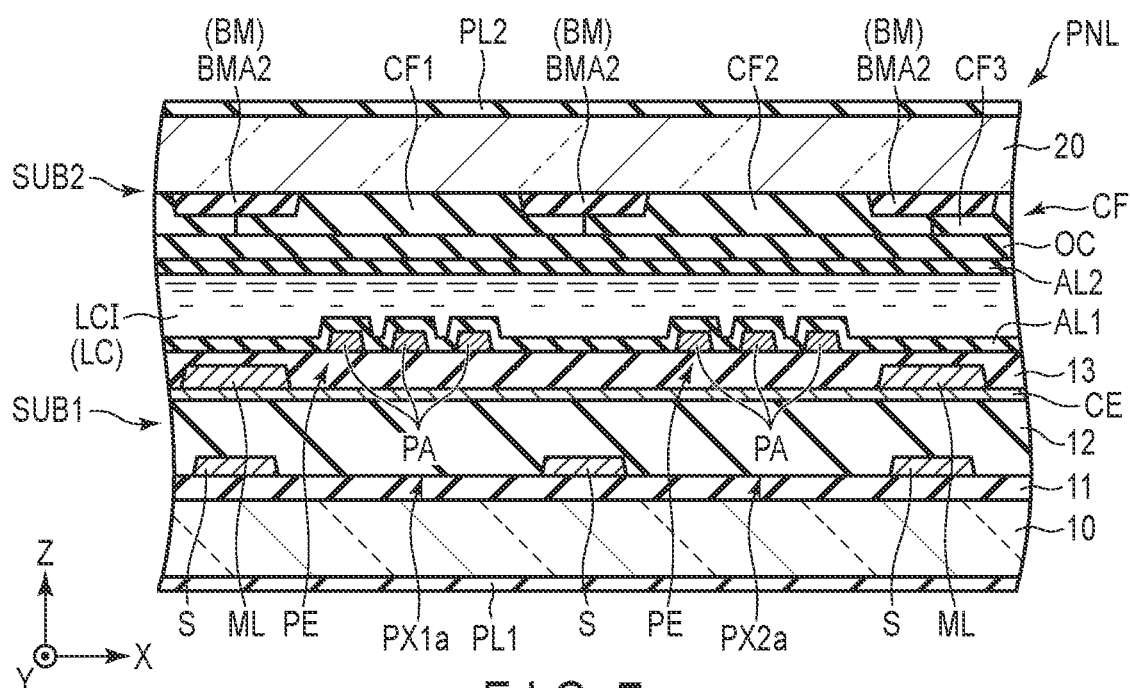
FIG. 7 is a cross-sectional view showing a liquid crystal display panel including the pixel shown in FIG. 5.

FIG. 7 is a cross-sectional view showing the liquid crystal display panel PNL including the pixels PX1 and PX2 shown in FIG. 5. The liquid crystal display panel PNL has a configuration corresponding to the fringe field switching (FFS) mode, which is one of the display modes using a horizontal electric field.

As shown in FIG. 7, the first substrate SUB1 comprises an insulating layer 11, the signal lines S, an insulating layer 12, the common electrode CE, a metal layer ML, an insulating layer 13, the pixel electrodes PE, and the like between the insulating substrate 10 and the alignment film AL1. In addition, a polarizer PL1 is formed outside the first substrate SUB1.

The insulating layer 11 is provided on the insulating substrate 10. The above-described scanning lines (G), gate electrodes and semiconductor layers of the pixel switching elements SWp, other insulating layers, and the like are arranged between the insulating substrate 10 and the insulating layer 11, though not described in detail. The signal lines S are formed on the insulating layer 11. The insulating layer 12 is provided on the insulating layer 11 and the signal lines S.

The common electrode CE is provided on the insulating layer 12. The metal layer ML is provided on the common electrode CE and is in contact with the common electrode CE. The metal layer ML is located just above the signal lines S. In the example illustrated, the first substrate SUB1 comprises the metal layer ML but the metal layer ML may be omitted. The insulating layer 13 is provided on the common electrode CE and the metal layer ML.

The pixel electrodes PE are formed on the insulating layer 13. Each of the pixel electrodes PE is located between the adjacent signal lines S and is opposed to the common electrode CE. In addition, each of the pixel electrodes PE includes slits at a position opposed to the common electrode CE (opening area AP). The common electrode CE and the pixel electrode PE are formed of a transparent conductive material such as ITO or IZO. The insulating layer 13 is sandwiched between the pixel electrode PE and the common electrode CE. The alignment film AL1 is provided on the insulating layer 13 and the pixel electrodes PE to cover the pixel electrode PE and the like.

In contrast, the second substrate SUB2 comprises the light-shielding layer BM including light-shielding portions BMA2, the color filter CF including colored layers CF1, CF2, and CF3, the transparent layer OC, the alignment film AL2, and the like on the side of the insulating substrate 20 opposed to the first substrate SUB1. The light-shielding portions BMA2 are formed on the inner surface of the insulating substrate 20. The light-shielding portions BMA2 are located just above the signal lines S and the metal layer ML. The colored layers CF1 and CF2 are formed on the inner surface of the insulating substrate 20, and partially overlap the light-shielding portions BMA2. The transparent layer OC covers the color filter CF. The alignment film AL2 covers the transparent layer OC. In addition, the polarizer PL2 is formed outside the second substrate SUB2.

Incidentally, the liquid crystal display panel PNL may be configured without the light-shielding portions BMA2 and the light-shielding portions BMA1 (FIG. 6) in the display area DA. In this case, in the display area DA, the metal layer ML may be formed in a grating shape and, not the light-shielding portions BMA1 and BMA2, but the metal layer ML may be made to comprise the light shielding function.

The liquid crystal layer LC includes a display liquid crystal layer LCI located in the display area DA. For example, the liquid crystal molecules contained in the display liquid crystal layer LCI are subjected to initial alignment in a transparent axis direction of the polarizer PL1 between the alignment films AL1 and AL2, in an off state in which the transmission axes of the polarizer PL1 and the polarizer PL2 are orthogonal to each other, no voltage (electric field) is generated between the pixel electrode PE and the common electrode CE in the pixel PX1, and no voltage is applied to the display liquid crystal layer LCI. Therefore, the pixel PX1 has the minimum transmittance and displays black since no phase difference occurs in the liquid crystal layer LC and since the transmission axes of the polarizer PL1 and the polarizer PL2 are orthogonal to each other. In other words, in the pixel PX1, the liquid crystal display panel PNL exerts the light shielding function.

In contrast, in the pixel PX1a, the liquid crystal molecules are aligned in a direction different from the initial alignment direction, and the alignment direction is controlled by the electric field, in an on state in which a voltage (electric field) is generated between the pixel electrodes PE and the common electrode CE and a voltage is applied to the display liquid crystal layer LCI. Therefore, a phase difference occurs in the liquid crystal layer LC and, in the pixel PX1, the liquid crystal display panel PNL exerts the light transmitting function. For this reason, the pixel PX1 in the on state exhibits a color corresponding to the colored layer CF1.

The mode of the liquid crystal display panel PNL is so-called a normally-black mode, which displays black in the off state, but may be so-called a normally-white mode, which displays black in the on state (and displays white in the off state).

The electrode closer to the display liquid crystal layer LCI (liquid crystal layer LC), of the pixel electrode PE and the common electrode CE, is the pixel electrode PE, and the pixel electrode PE functions as the display electrode as described above. However, the electrode closer to the display liquid crystal layer LCI (liquid crystal layer LC), of the pixel electrode PE and the common electrode CE, may be the common electrode CE. In such a case, the common electrode CE includes a slit located in the opening area AP, functions as a display electrode as described above, and includes a linear display electrode instead of the pixel electrode PE.

Figure 8:
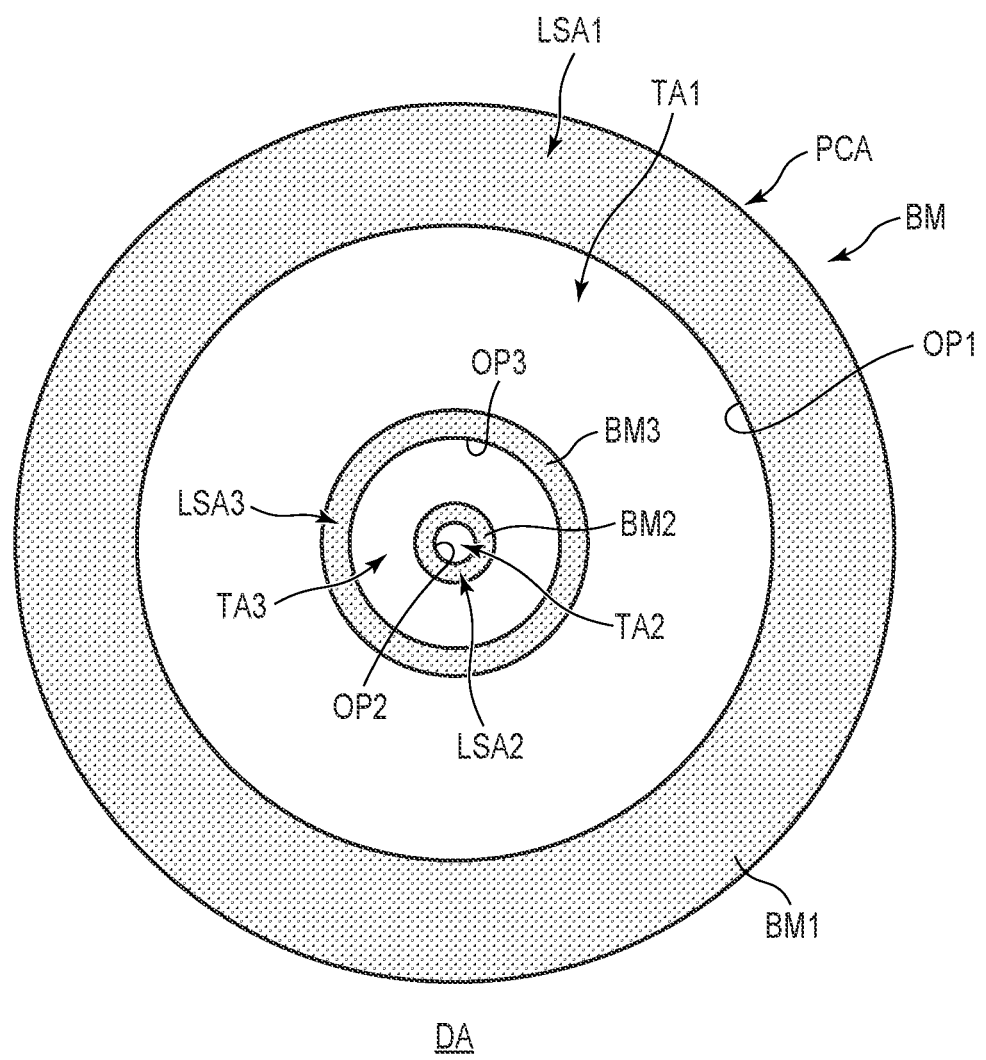
FIG. 8 is a plan view showing a light-shielding layer in an incident light control area of the liquid crystal display panel.

FIG. 8 is a plan view showing the light-shielding layer BM in the incident light control area PCA of the liquid crystal display panel PNL. In the figure, the light-shielding layer BM is marked with a dot pattern. As shown in FIG. 8, the incident light control area PCA includes a second incident light adjustment area TA2 in the center, and includes the first light-shielding area LSA1, the first incident light adjustment area TA1, a third light-shielding area LSA3, a third incident light adjustment area TA3, a second light-shielding area LSA2, and the second incident light adjustment area TA2, from the outside to the center.

The first light-shielding area LSA1 is located on the outermost periphery of the incident light control area PCA and has an annular shape. The first light-shielding area LSA1 has an outer periphery which is in contact with the display area DA. The first incident light adjustment area TA1 is surrounded by the first light-shielding area LSA1, has an outer periphery which is in contact with the first light-shielding area LSA1, and has an annular shape. The second incident light adjustment area TA2 is located in the center of the incident light control area PCA, has an outer periphery which is in contact with the second light-shielding area LSA2, and has a circular shape.

The second light-shielding area LSA2 has an inner periphery which is in contact with the second incident light adjustment area TA2, surrounds the second incident light adjustment area TA2, and has an annular shape. The third light-shielding area LSA3 is surrounded by the first incident light adjustment area TA1, has an outer periphery which is in contact with the first incident light adjustment area TA1, and has an annular shape. The third incident light adjustment area TA3 is surrounded by the third light-shielding area LSA3, has an outer periphery which is in contact with the third light-shielding area LSA3 and an inner periphery which is in contact with the second light-shielding area LSA2, and has an annular shape.

The first light-shielding area LSA1, the second light-shielding area LSA2, and the third light-shielding area LSA3 may be referred to as annular light-shielding areas. The first incident light adjustment area TA1 and the third incident light adjustment area TA3 may be referred to as annular incident light adjustment areas. The second incident light adjustment area TA2 may be referred to as a circular incident light adjustment area. The first incident light adjustment area TA1, the second incident light adjustment area TA2, and the third incident light adjustment area TA3 are the areas where the quantity of the transmitted light can be adjusted.

In the incident light control area PCA, the light-shielding layer BM includes the first light-shielding portion BM1, the first opening OP1, a second light-shielding portion BM2, a second opening OP2, a third light-shielding portion BM3, and a third opening OP3. The first light-shielding portion BM1 is located in the first light-shielding area LSA1 and has an annular shape. The second light-shielding portion BM2 is located in the second light-shielding area LSA2 and has an annular shape. The third light-shielding portion BM3 is located in the third light-shielding area LSA3 and has an annular shape.

Each light-shielding portion of the first light-shielding portion BM1, the second light-shielding portion BM2, and the third light-shielding portion BM3 may be referred to as an annular light-shielding portion. The first opening OP1 and the third opening OP3 have an annular shape, and the second opening OP2 has a circular shape.

Incidentally, the first light-shielding portion BM1, the second light-shielding portion BM2, and the third light-shielding portion BM3 can be formed of the same material, in the same layer, by the same processes as the light-shielding layer BM formed in the display area DA.

An outer peripheral circle of the first light-shielding portion BM1, an outer peripheral circle of the first incident light adjustment area TA1, an outer peripheral circle of the second light-shielding portion BM2, the second incident light adjustment area TA2, an outer peripheral circle of the third light-shielding portion BM3, and an outer peripheral circle of the third incident light adjustment area TA3 are concentric circles.

The liquid crystal display panel PNL may be configured without the third light-shielding area LSA3, the third light-shielding portion BM3, and the third incident light adjustment area TA3. In this case, an inner periphery of the first incident light adjustment area TA1 may be in contact with the second light-shielding area LSA2.

Figure 9:
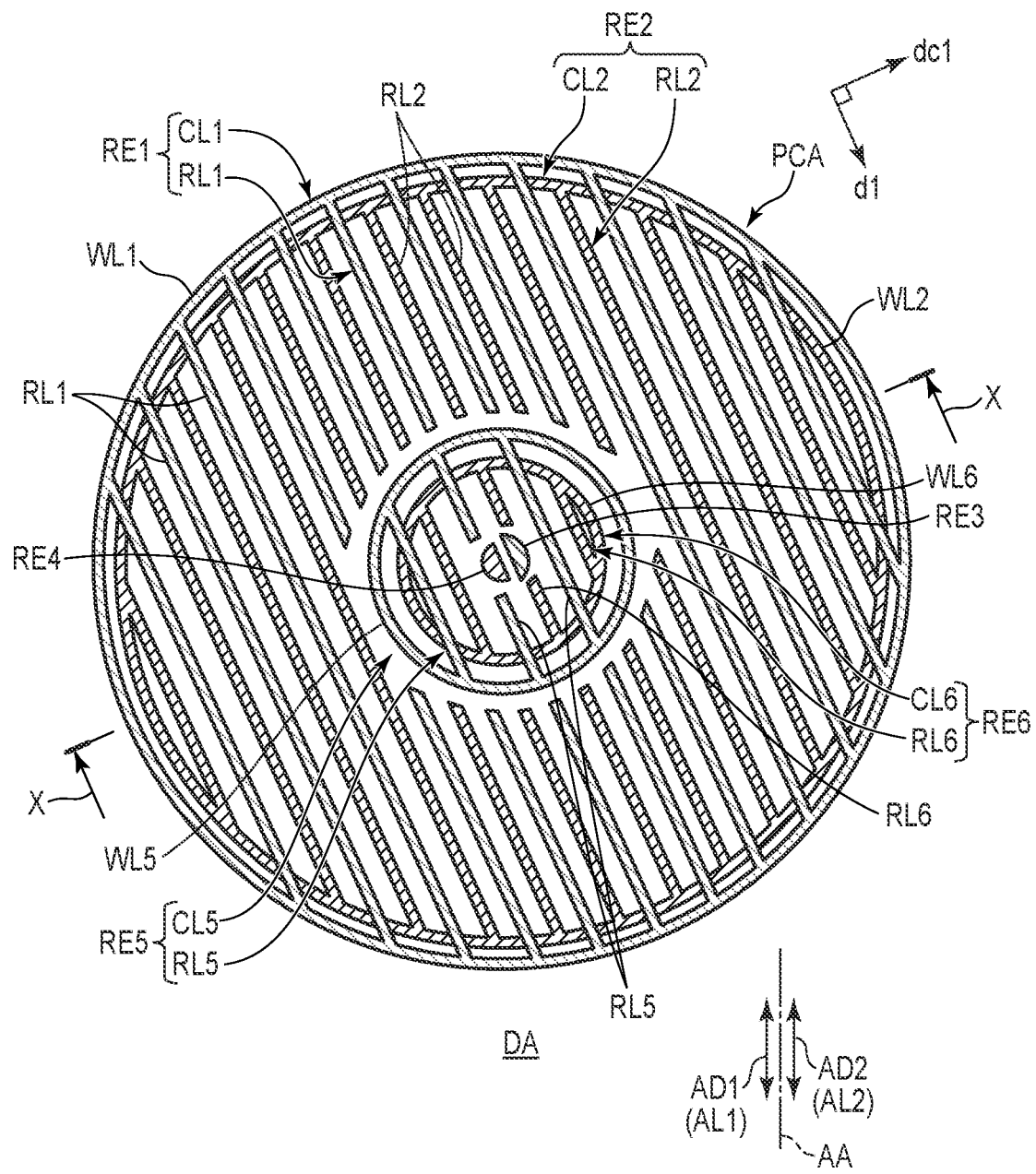
FIG. 9 is a plan view showing a plurality of control electrodes of the liquid crystal display panel.

FIG. 9 is a plan view showing an electrode structure of the incident light control area PCA of the liquid crystal display panel PNL, illustrating a plurality of control electrode structures RE. As shown in FIG. 9 and FIG. 8, the liquid crystal display panel PNL comprises a first control electrode structure RE1, a second control electrode structure RE2, the third control electrode structure RE3, the fourth control electrode structure RE4, a fifth control electrode structure RE5, and a sixth control electrode structure RE6.

FIG. 9 is a schematic view showing that the electrode has a configuration conforming to the in-plane switching (IPS) mode in the incident light control area PCA.

The first control electrode structure RE1 comprises a first power supply line CL1 and the first control electrodes RL1.

The first power supply line CL1 is located in the first light-shielding area LSA1 and includes a first line WL1. In this embodiment, the first line WL1 has an annular shape.

A plurality of first control electrodes RL1 are located in the first light-shielding area LSA1 and the first incident light adjustment area TA1, are electrically connected to the first line WL1, extend linearly in the first extending direction d1, and are arranged and spaced apart in the orthogonal direction dc1. The first control electrodes RL1 are arranged inside the first line WL1.

A plurality of first control electrodes RL1 include the first control electrode RL1 having both ends connected to the first line WL1, and the first control electrode RL1 having one end connected to the first line WL1 and the other end not connected to the first line WL1.

The second control electrode structure RE2 comprises a second power supply line CL2 and the second control electrodes RL2. The second power supply line CL2 includes a second line WL2. The second control electrode structure RE2 has the same structure as the first control electrode structure RE1. The second line WL2 is located on an inner side than the first line WL1, but may be located on an outer side than the first line WL1.

A plurality of first control electrodes RL1 and a plurality of second control electrodes RL2 are arranged alternately in the orthogonal direction dc1.

The third control electrode structure RE3 and the fourth control electrode structure RE4 are located in the second light-shielding area LSA2 and the second incident light adjustment area TA2. The third control electrode structure RE3 and the fourth control electrode structure RE4 are shown as semicircular shapes having sides parallel to the first extending direction d1. The side of the third control electrode structure RE3 and the side of the fourth control electrode structure RE4 are located and spaced apart in the orthogonal direction dc1. Incidentally, the shapes of the third control electrode structure RE3 and the fourth control electrode structure RE4 can be variously modified.

The fifth control electrode structure RE5 comprises a fifth power supply line CL5 and fifth control electrodes RL5. The fifth power supply line CL5 includes a fifth line WL5. The fifth power supply line CL5 is located in the third light-shielding area LSA3 and has an annular shape.

A plurality of fifth control electrodes RL5 are located in the third light-shielding area LSA3 and the third incident light adjustment area TA3, are electrically connected to the fifth line WL5, extend linearly in the first extending direction d1, and are arranged and spaced apart in the orthogonal direction dc1. The fifth line WL5 and the fifth control electrodes RL5 are formed integrally. The fifth control electrodes RL5 are arranged inside the fifth line WL5.

A plurality of fifth control electrodes RL5 include the fifth control electrode RL5 having both ends connected to the fifth line WL5, and the fifth control electrode RL5 having one end connected to the fifth line WL5 and the other end not connected to the fifth line WL5.

The sixth control electrode structure RE6 comprises a sixth power supply line CL6 and sixth control electrodes RL6. The sixth power supply line CL6 includes a sixth line WL6. The sixth control electrode structure RE6 has the same structure as the fifth control electrode structure RE5. The sixth line WL6 is located on an inner side than the fifth line WL5, but may be located on an outer side than the fifth line WL5.

A plurality of fifth control electrodes RL5 and a plurality of sixth control electrodes RL6 are arranged alternately in the orthogonal direction dc1.

Incidentally, the first power supply line CL1, the second power supply line CL2, the fifth power supply line CL5, and the sixth power supply line CL6 may be formed of a laminated layer body of transparent conductive layers and metal layers.

As described with reference to FIG. 7, the pixel electrodes PE and the common electrode CE in the display area DA are formed of a transparent conductive material (transparent conductive film), and the pixel PX includes transparent conductive films of two different layers. The first line WL1 to the sixth line WL6 can be formed of one of the two layers of the transparent conductive films, and the first control electrode RL1 to the sixth control electrode RL6 can be formed of the other transparent conductive film, to enable the first control electrode RL1 to the sixth control electrode RL6 to be formed in the same layer. Incidentally, the first line WL1 to the sixth line WL6 can also be formed of multi-layered films of the transparent conductive films and metal films.

The liquid crystal display panel PNL has a configuration conforming to the IPS mode, which is one of the display modes using the lateral electric field in the incident light control area PCA. Each of the above-described first control electrode RL1 to sixth control electrode RL6 has a shape different from the above-described shape of the pixel electrode PE conforming to the FFS mode.

As represented by the first control electrode RL1 and the second control electrode RL2, voltages are supplied to the alternately arranged control electrodes, and the liquid crystal molecules are driven by the potential difference generated between the electrodes.

In the incident light control area PCA, the above-described alignment films AL1 and AL2 have an alignment axis AA parallel to the direction Y. That is, the alignment axis AA of the alignment films AL1 and AL2 is parallel in the display area DA and the incident light control area PCA. In the incident light control area PCA, the alignment direction AD1 of the alignment film AL1 is parallel to the direction Y, and the alignment direction AD2 of the alignment film AL2 is parallel to the alignment direction AD1.

In a state in which a voltage is not applied to the liquid crystal layer LC, the initial alignment direction of the liquid crystal molecules of the display area DA is the same as the initial alignment direction of the liquid crystal molecules of the incident light control area PCA. The above-described linear pixel electrodes (linear display electrodes) PA and the control electrodes RL extend in parallel. On the X-Y plane of the first embodiment, each of the first extending direction d1 and the second extending direction d2 is inclined to the direction Y at 10 degrees. For this reason, the direction of rotation of the liquid crystal molecules can be arranged by the display area DA and the incident light control area PCA. The inclination of the linear pixel electrodes PA has been described. However, the above-described matters are the same as those in a case of replacing the inclination of the linear pixel electrodes PA with the inclination of the slit of the common electrode.

Figure 10:
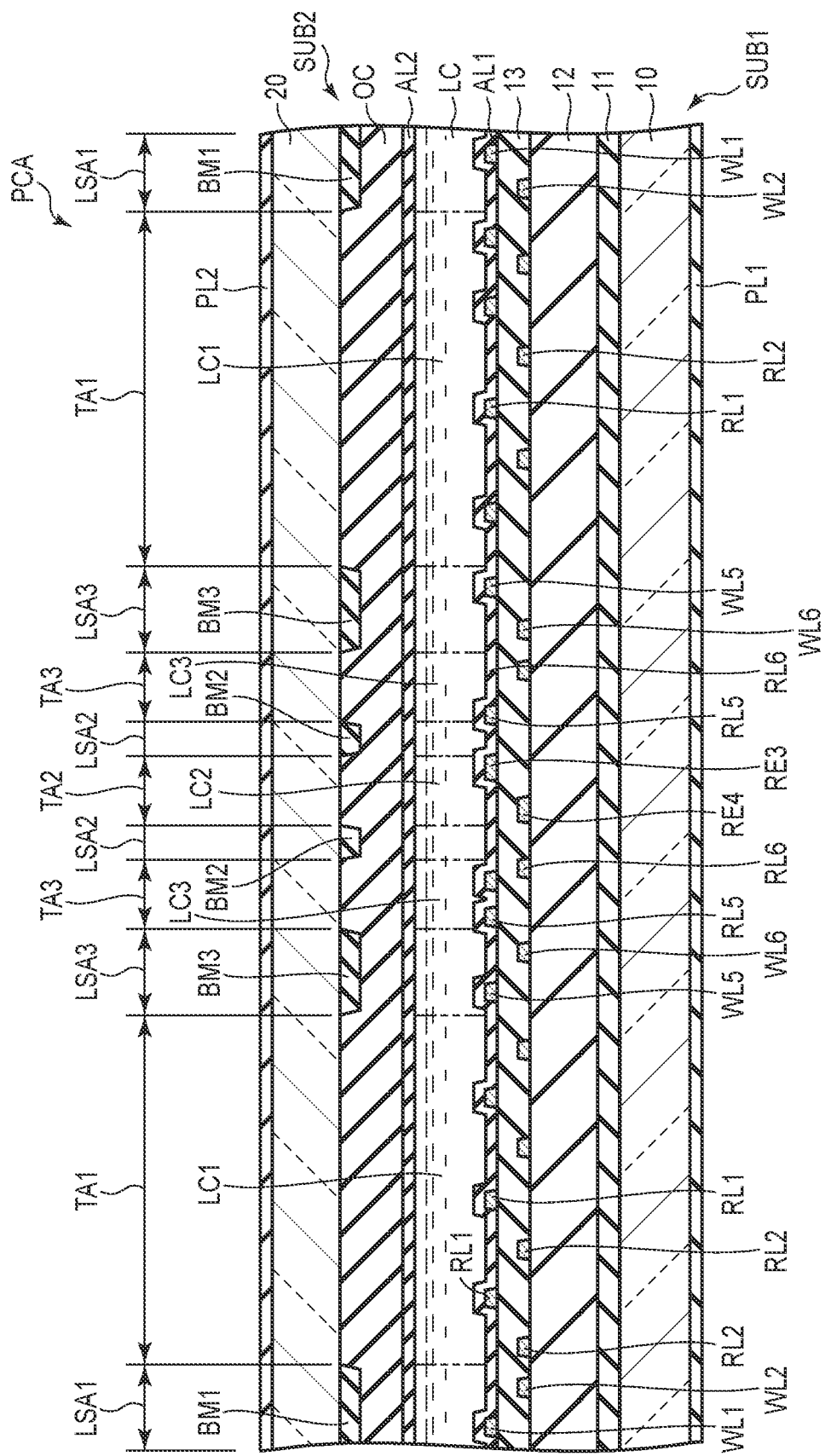
FIG. 10 is a cross-sectional view showing the incident light control area of the liquid crystal display panel.

FIG. 10 is a cross-sectional view showing the incident light control area PCA of the liquid crystal display panel PNL. In FIG. 10, illustration of the signal lines S, the scanning lines G, and the like is omitted.

As shown in FIG. 10, one of two conductors formed to sandwich the insulating layer 13 is formed in the same layer as one of the pixel electrode PE and the common electrode CE, and is formed of the same material as the one of the electrodes. The other of the two conductors is provided in the same layer as the other of the pixel electrode PE and the common electrode CE, and is formed of the same material as the other of the electrodes.

In FIG. 10, the second line WL2, the second control electrode RL2, the fourth control electrode structure RE4, the sixth line WL6, and the sixth control electrode RL6 are provided on the insulating layer 12 and covered with the insulating layer 13. The second line WL2, the second control electrode RL2, the fourth control electrode structure RE4, the sixth line WL6, and the sixth control electrode RL6 are provided in the same layer as the common electrode CE and formed of the same transparent conductive material as the common electrode CE.

The first line WL1, the first control electrode RL1, third control electrode structure RE3, the fifth line WL5, and the fifth control electrode RL5 are provided on the insulating layer 13 and covered with the alignment film AL1. The first control electrode RL1, the third control electrode structure RE3, the fifth line WL5, and the fifth control electrode RL5 are provided in the same layer as the pixel electrode PE and formed of the same transparent conductive material as the pixel electrode PE.

For example, the insulating layer 13 is sandwiched between the first control electrode RL1 (first control electrode structure RE1) and the second control electrode RL2 (second control electrode structure RE2). Incidentally, the first control electrode RL1, the second control electrode RL2, the third control electrode structure RE3, the fourth control electrode structure RE4, the fifth control electrode RL5, and the sixth control electrode RL6 may be formed in the same layer.

In the incident light control area PCA, the alignment film AL1 covers the first line WL1, the first control electrodes RL1, the second line WL2, the second control electrodes RL2, the third control electrode structure RE3, fourth control electrode structure RE4, the fifth line WL5, the fifth control electrodes RL5, the sixth line WL6, and the sixth control electrodes RL6, and is in contact with the liquid crystal layer LC.

In the second substrate SUB2, the color filter CF is not provided in the incident light control area PCA.

The liquid crystal layer LC includes a first control liquid crystal layer LC1 located in the first incident light adjustment area TA1, a second control liquid crystal layer LC2 located in the second incident light adjustment area TA2, and a third control liquid crystal layer LC3 located in the third incident light adjustment area TA3.

A voltage generated by the first control electrode RL1 and the second control electrode RL2 is applied to the first control liquid crystal layer LC1. A voltage generated by the third control electrode structure RE3 and the fourth control electrode structure RE4 is applied to the second control liquid crystal layer LC2. A voltage generated by the fifth control electrode RL5 and the sixth control electrode RL6 is applied to the third control liquid crystal layer LC3.

Driving the first control electrode structure RE1 and the second control electrode structure RE2 to apply the voltage to the first control liquid crystal layer LC1, of the plurality of control electrodes RL, will be focused. A first control voltage is applied to the first control electrode structure RE1, and a second control voltage is applied to the second control electrode structure RE2.

One of the first control voltage and the second control voltage may be fixed to the reference voltage, similarly to the common electrode, and the other of the first control voltage and the second control voltage may be switched to the reference voltage, a first output voltage that is more positive than the reference voltage, or a second output voltage that is more negative than the reference voltage.

Alternatively, one of the first control voltage and the second control voltage may be a first output voltage, and the other of the first control voltage and the second control voltage may be a second output voltage, during any period.

Setting the first control voltage and the second control voltage as described above can contribute to, for example, polarity inversion drive. Incidentally, driving the first control electrode structure RE1 and the second control electrode structure RE2 can also be applied to driving the third control electrode structure RE3 and the fourth control electrode structure RE4, and driving the fifth control electrode structure RE5 and the sixth control electrode structure RE6.

Next, a circuit configuration for driving the first control electrode structure RE1 and the second control electrode structure RE2 that represent the first control electrode structure RE1 to the sixth control electrode structure RE6 will be described. The elements described herein can be applied to a circuit configuration for a set of the third control electrode structure RE3 and the fourth control electrode structure RE4, and a circuit configuration for a set of the fifth control electrode structure RE5 and the sixth control electrode structure RE6.

First, the first control electrode structure RE1, the second control electrode structure RE2, and peripheral circuits thereof will be described. FIG. 11 is a diagram showing an equivalent circuit of a plurality of control switch groups Wa and Wb, a plurality of level shift units SIa and SIb, a plurality of charge pumps CP1 and CP2, the first control electrode structure RE1, the scanning lines G, and the signal lines S of the liquid crystal display panel PNL, together with a plurality of pixels PX, a scanning line driving circuit GD, and a signal line driving circuit SD.

As shown in FIG. 11, the liquid crystal display panel PNL comprises the scanning line driving circuit GD and the signal line driving circuit SD. The scanning line driving circuit GD is connected to the plurality of scanning lines G. The signal line driving circuit SD is connected to the plurality of signal lines S. Incidentally, parts of the scanning line driving circuit GD and the signal line driving circuit SD may be provided outside the liquid crystal display panel PNL.

The liquid crystal display panel PNL further comprises the plurality of control switch groups Wa and Wb, the plurality of level shift units SIa and SIb, and the plurality of charge pumps CP1 and CP2. The control switch group Wa comprises a control switch W1a and a control switch W2a. The control switch group Wb comprises a control switch W1b and a control switch W2b. Each of the control switches W1a, W2a, W1b, and W2b is electrically connected to the plurality of scanning lines G, and a corresponding signal line S among the plurality of signal lines S.

For example, the plurality of scanning lines G electrically connected to the control switch W1a are the same as the plurality of scanning lines G electrically connected to the control switch W2a. The plurality of scanning lines G electrically connected to the control switch W1b are the same as the plurality of scanning lines G electrically connected to the control switch W2b. The control switch W1a and the control switch W1b are electrically connected to different signal lines. The control switch W2a and the control switch W2b are electrically connected to different signal lines.

Control signals SG are supplied from the scanning line driving circuit GD via the scanning lines G, and a first power source voltage vdd and a second power source voltage vss are supplied from the signal line driving circuit SD via the signal lines S, to each of the control switches W1a, W2a, W1b, and W2b.

A voltage level of the control signal SG is changed between gate high voltage VGH and a gate low voltage VGL. In this embodiment, VGH=+8V and VGL=−8V.

The voltage level output from the signal line driving circuit SD falls within a range between a first power source voltage vdd and a second power source voltage vss. For example, a level of the first power source voltage vdd is positive relative to a level (ground level) of a reference voltage (gnd), and a level of the second power source voltage vss is negative relative to the level of the reference voltage. The voltage level of the image signal Vsig output from the signal line driving circuit SD for the normal pixel PX falls within a range between the first power source voltage vdd and the second power source voltage vss. In this embodiment, vdd=+5V and vss=−5V.

The control switch W1a and the control switch W2a are electrically connected to the level shift unit SIa. The level shift unit SIa includes a level shift circuit LS1a and a level shift circuit LS2a. In this embodiment, the control switch W1a is electrically connected to the level shift circuit LS1a, and the control switch W2a is electrically connected to the level shift circuit LS2a. The signal output from the control switch W1a is input to the level shift circuit LS1a, and the signal output from the control switch W2a is input to the level shift circuit LS2a.

The level shift unit SIa is electrically connected to the charge pump CP1. In this embodiment, each of the level shift circuit LS1a and the level shift circuit LS2a is electrically connected to the charge pump CP1. Each of the signal output from the level shift circuit LS1a and the signal output from the level shift circuit LS2a is input to the charge pump CP1. The charge pump CP1 generates a first output voltage gvdd, based on the signal supplied from the level shift unit SIa. An absolute value of the first output voltage gvdd is larger than an absolute value of the first power source voltage vdd. In this embodiment, the first output voltage gvdd is +10V. The first output voltage gvdd is input to the first control electrode structure RE1 (first control electrodes RL1) or the level shift units SIa and SIb via a switch SSW1 in the on state. The charge pump CP1 is connected to, for example, the first control electrode structure RE1 (first control electrodes RL1) that is a load unit.

The control switch W1b and the control switch W2b are electrically connected to the level shift unit SIb. The level shift unit SIb includes a level shift circuit LS1b and a level shift circuit LS2b. In this embodiment, the control switch W1b is electrically connected to the level shift circuit LS1b, and the control switch W2b is electrically connected to the level shift circuit LS2b. The signal output from the control switch W1b is input to the level shift circuit LS1b, and the signal output from the control switch W2b is input to the level shift circuit LS2b.

The level shift unit SIb is electrically connected to the charge pump CP2. In this embodiment, each of the level shift circuit LS1b and the level shift circuit LS2b is electrically connected to the charge pump CP2. Each of the signal output from the level shift circuit LS1b and the signal output from the level shift circuit LS2b is input to the charge pump CP2. The charge pump CP2 generates a second output voltage gvss, based on the signal supplied from the level shift unit SIb. An absolute value of the second output voltage gvss is larger than an absolute value of the second power source voltage vss. In this embodiment, the second output voltage gvss is −10V. The second output voltage gvss is input to the first control electrode structure RE1 (first control electrodes RL1) or the level shift units SIa and SIb via a switch SSW2 in the on state. The charge pump CP2 is connected to, for example, the first control electrode structure RE1 (first control electrodes RL1) that is a load unit, similarly to the charge pump CP1.

The plurality of pixels PX are connected to the scanning lines G and signal line S connected to each of the control switches W1a, W2a, W1b, and W2b. For example, the signal line S connected to the control switch W1a is the same as the signal line S connected to the pixel switching element SWp of one pixel PXα among the plurality of pixels PX. In addition, each scanning line G connected to the control switch W1a is the same as each scanning line G connected to the pixel switching element SWp of one pixel PXβ among the plurality of pixels PX.

The control signal SG is also supplied to the pixel switching element SWp of the pixel PX, and the voltage level of the control signal SG is changed between two values, i.e., the gate low voltage VGL and the gate high voltage VGH. The pixel switching element SWp of the pixel PX changes outputting or not outputting the image signal Vsig to the pixel electrode PE. The plurality of pixel switching elements SWp and the plurality of pixel electrodes PE are located in the display area DA.

The signal line driving circuit SD outputs the first power source voltage vdd and the second power source voltage vss to the signal lines S connected to the respective control switches W1a, W2a, W1b, and W2b, separately from the image signal Vsig. For this reason, each of the control switches W1a, W2a, W1b, and W2b selectively outputs either of the first power source voltage vdd and the second power source voltage vss, for each horizontal scanning period.

The positions of the control switches W1a, W2a, W1b, and W2b, the level shift units SIa and SIb, and the charge pumps CP1 and CP2, in the incident light control area PCA, will be described here.

As shown in FIG. 8, FIG. 9, and FIG. 11, the control switches W1a, W2a, W1b, and W2b, the level shift units SIa and SIb, and the charge pumps CP1 and CP2, are located in the light-shielding area LSA. In the embodiment, the control switches W1a, W2a, W1b, and W2b, the level shift units SIa and SIb, and the charge pumps CP1 and CP2, are located in the first light-shielding area LSA1.

The control switch W, the level shift unit SI, and the charge pump CP electrically connected to each of the control electrode structures RE other than the first control electrode structure RE1 are also desirably located in the light-shielding area LSA such as the first light-shielding area LSA1. Since the control switch W, the level shift unit SI, and the charge pump CP are not located in the incident light control area TA, reduction of the incident light control area TA can be prevented.

Figure 12:
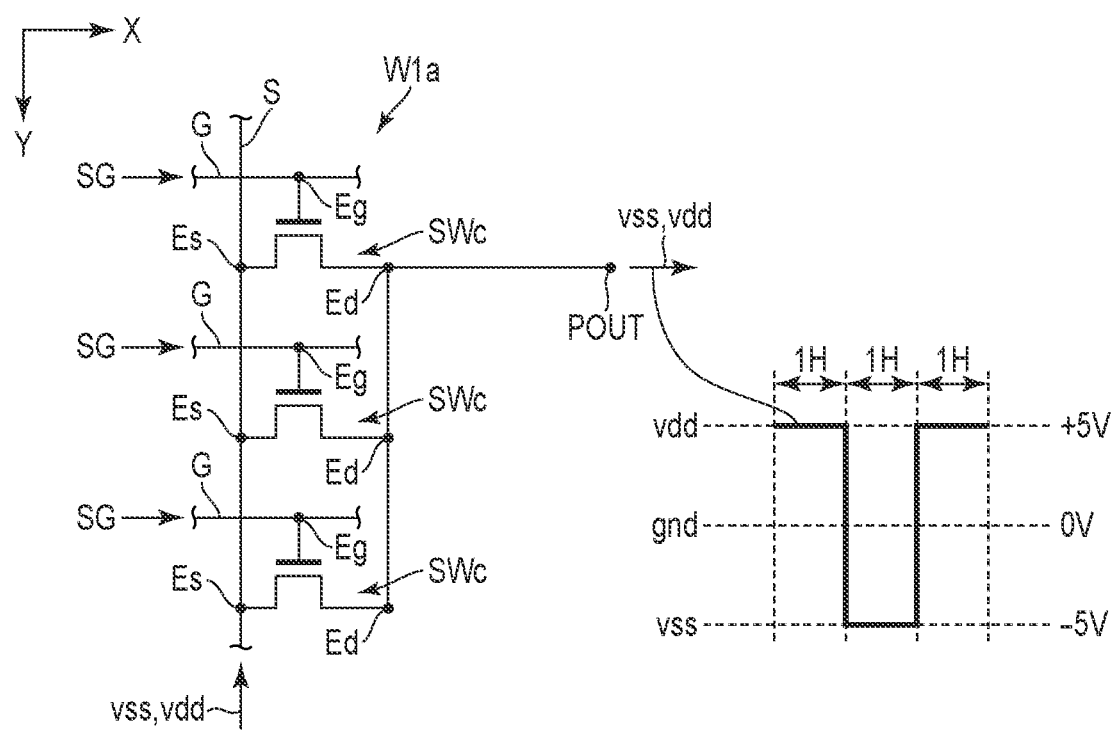
FIG. 12 is a circuit diagram showing a part of a control switch shown in FIG. 11, together with an example of a waveform of a signal output from the control switch.

Next, the control switch W1a representing the control switches W1a, W2a, W1b, and W2b will be described. The elements described herein can be applied to the other control switches W. FIG. 12 is a circuit diagram showing a part of the control switch W1a shown in FIG. 11, together with an example of a waveform of the signal output from the control switch W1a.

As shown in FIG. 11 and FIG. 12, the control switch W1a includes a plurality of control switching elements SWc. The control switching element SWc is composed of, for example, an N-channel transistor (TFT). In this embodiment, the control switching element SWc is constituted similarly to the pixel switching element SWp.

The control switching element SWc includes a gate electrode Eg electrically connected to a corresponding scanning line G among the plurality of scanning lines G, a source electrode Es electrically connected to a corresponding signal line S among the plurality of signal lines S, and a drain electrode Ed. The plurality of scanning lines G electrically connected to the plurality of gate electrodes Eg of the plurality of control switching elements SWc of the control switch W1a are different from each other. The plurality of drain electrodes Ed of the plurality of control switching elements SWc of the control switch W1a are electrically bundled and connected to a power source voltage output terminal POUT of the control switch W1a.

FIG. 12 shows three control switching elements SWc, and the number of the control switching elements SWc provided in the control switch W1a is not limited to three but may be a plural number.

In this embodiment, the plurality of scanning lines G electrically connected to the plurality of gate electrodes Eg of the plurality of control switching elements SWc of the control switch W1a are provided continuously in the direction Y. In addition, the plurality of source electrodes Es of the plurality of control switching elements SWc of the control switch W1a are electrically connected to the same signal line S.

As described above, since the control switch W1a comprises the plurality of control switching elements SWc, the control switch W1a can freely generate signals having different voltage levels in a unit of one horizontal scanning period (1H). For this reason, the voltage level of the signal which the control switch W1a outputs from the power source voltage output terminal POUT can be fixed or varied between −5V and +5V for one vertical scanning period (one frame period). In the example shown in FIG. 12, the voltage level of the signal output from the control switch W1a is changed alternately to the first power source voltage vdd and the second power source voltage vss for each 1H. The level of the reference voltage gnd is the ground level and is substantially 0V.

In contrast, the voltage level of the image signal Vsig output from the pixel switching element SWp to the pixel electrode PE is not varied for one vertical scanning period (one frame period). The pixel electrode PE may be referred to as a load unit different from the first control electrode structure RE1 (first control electrodes RL1).

Next, a configuration of a part of the circuit of the liquid crystal display panel PNL shown in FIG. 11 will be described. FIG. 13 is a circuit diagram showing an electric system for generating the first output voltage gvdd, illustrating two control switches W1a and W2a, two level shift circuits LS1a and LS2a, one charge pump CP1, and the like shown in FIG. 11.

As shown in FIG. 13, the control switch W1a outputs the first power source voltage vdd and the second power source voltage vss input from the signal line S to the power source voltage output terminal POUT of the own control switch W1a in time division. The power source voltage output terminal POUT of the control switch W1a is electrically connected to an input terminal IN of the level shift circuit LS1a. One of electrodes of a capacitor (smoothing capacitor) C1 is electrically connected between the control switch W1a and the level shift circuit LS1a. The other electrode of the capacitor C1 is, for example, electrically connected to the common electrode CE and electrically fixed to a common voltage Vcom.

The level shift circuit LS1a outputs an output signal Sig1 to the charge pump CP1.

The control switch W2a outputs the first power source voltage vdd and the second power source voltage vss input from the signal line S to the power source voltage output terminal POUT of the own control switch W2a in time division. The power source voltage output terminal POUT of the control switch W2a is electrically connected to an input terminal IN of the level shift circuit LS2a. One of electrodes of a capacitor (smoothing capacitor) C2 is electrically connected between the control switch W2a and the level shift circuit LS2a. The other electrode of the capacitor C2 is, for example, electrically connected to the common electrode CE and electrically fixed to a common voltage Vcom.

The level shift circuit LS2a outputs an output signal Sig2 to the charge pump CP1.

The charge pump CP1 comprises a plurality of switches SW1, SW2, SW3, and SW4, a capacitor Cn, a charge pump capacitor Ccg, a capacitor (smoothing capacitor) Ct, a power input terminal Tc1, and an output terminal OUT. The switches SW1, SW2, SW3, and SW4 are composed of transistors (TFTs). In this embodiment, the switches SW1, SW3, and SW4 are composed of P-channel TFTs, and the switch SW2 is composed of an N-channel TFT. Each of one of electrodes of the capacitor Cn and one of electrodes of the capacitor Ct is electrically connected to the ground (gnd).

On the one hand the output signal Sig1 output from the level shift circuit LS1a is supplied to a control terminal (gate electrode) of the switch SW2, but on the other hand the output signal Sig1 is supplied to a control terminal (gate electrode) of the switch SW1 via an inverter IV. On the one hand the output signal Sig2 output from the level shift circuit LS2a is supplied to a control terminal (gate electrode) of the switch SW3 via the inverter IV, but on the other hand the output signal Sig2 is supplied to a control terminal (gate electrode) of the switch SW4.

For a period of an initial stage of the drive before the charge pump CP1 generates the first output voltage gvdd and the charge pump CP2 generates the second output voltage gvss, first power terminals T1 of the level shift circuits LS1a and LS2a and the inverter IV are precharged with the first power source voltage vdd, and second power terminals T2 of the level shift circuits LS1a and LS2a and the inverter IV are precharged with second power source voltage vss.

For a period after the charge pump CP1 generates the first output voltage gvdd and the charge pump CP2 generates the second output voltage gvss, the first power terminals T1 of the level shift circuits LS1a and LS2a and the inverter IV are supplied with the first output voltage gvdd from the charge pump CP1, and second power terminals T2 of the level shift circuits LS1a and LS2a and the inverter IV are supplied with the second output voltage gvss from the charge pump CP2.

Operations for the period of the initial stage of drive before the charge pump CP1 generates the first output voltage gvdd and the charge pump CP2 generates the second output voltage gvss will be described.

First, the control switch W1a outputs the first power source voltage vdd to the level shift circuit LS1a, and the control switch W2a outputs the second power source voltage vss to the level shift circuit LS2a. Then, the level shift circuit LS1a outputs the first power source voltage vdd as the output signal Sig1, and the level shift circuit LS2a outputs the second power source voltage vss as the output signal Sig2. The first power source voltage vdd (output signal Sig1) is inverted into the second power source voltage vss by the inverter IV, and the second power source voltage vss (output signal Sig2) is inverted into the first power source voltage vdd by the inverter IV.

Thus, at the charge pump CP1, the switches SW1 and SW2 become the on state, and the switches SW3 and SW4 becomes the off state. A current flows from the power input terminal Tc1 to the charge pump capacitor Ccg via the switch SW1. A voltage level of an electrode EL1 of the charge pump capacitor Ccg is set to the first power source voltage vdd, and a voltage level of an electrode EL2 of the charge pump capacitor Ccg is set to the reference voltage (gnd) level. The first power source voltage vdd is supplied from the signal line to the charge pump CP1, and the charge pump capacitor Ccg is thereby charged.

After that, the control switch W1a outputs the second power source voltage vss to the level shift circuit LS1a, and the control switch W2a outputs the first power source voltage vdd to the level shift circuit LS2a. Then, the level shift circuit LS1a outputs the second power source voltage vss as the output signal Sig1, and the level shift circuit LS2a outputs the first power source voltage vdd as the output signal Sig2. The second power source voltage vss (output signal Sig1) is inverted into the first power source voltage vdd by the inverter IV, and the first power source voltage vdd (output signal Sig2) is inverted into the second power source voltage vss by the inverter IV.

Thus, at the charge pump CP1, the switches SW1 and SW2 are changed to the off state, and the switches SW3 and SW4 are changed to the on state. A current flows from the power input terminal Tc1 to the electrode EL2 of the charge pump capacitor Ccg via the switch SW3. A voltage level of the electrode EL2 of the charge pump capacitor Ccg rises from the reference voltage (gnd) level (substantially 0V) to the first power source voltage vdd level (+5V). Then, the voltage level of the electrode EL1 also rises by +5V by the capacitive coupling of the charge pump capacitor Ccg. The voltage level of the electrode EL1 is set to the first output voltage gvdd, i.e., +10V.

As described above, the charge pump capacitor Ccg is further charged to hold the first output voltage gvdd by supplying the first power source voltage vdd from the signal line to the charge pump CP1. As described above, the first output voltage gvdd generated at the charge pump CP1 is output to the output terminal OUT via the switch SW4. The charge pump CP1 outputs the first output voltage gvdd to the first control electrode structure RE1 (first control electrodes RL1) and the like.

The charge pump CP1 can generate the first output voltage gvdd depending on the voltage (first power source voltage vdd) input to the power input terminal Tc1. In other words, the charge pump CP1 can make the first power source voltage vdd input to the power input terminal Tc1 rise to the first output voltage gvdd.

Figure 14:
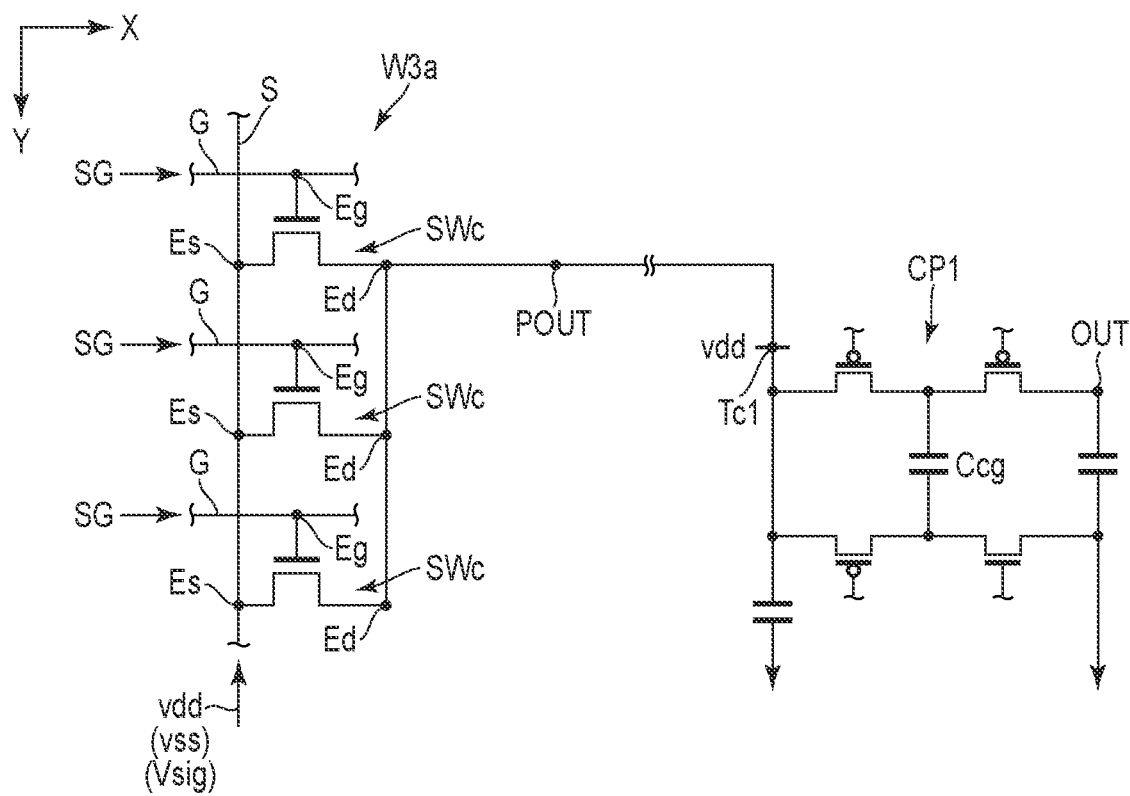
FIG. 14 is a circuit diagram showing a part of a control switch different from a plurality of control switches shown in FIG. 11, and the charge pump shown in FIG. 11 and FIG. 13, illustrating a state in which a power source voltage output terminal of the control switch is connected to a power terminal of the charge pump.

Next, means for supplying the first power source voltage vdd to the power input terminal Tc1 of the charge pump CP1 will be described. FIG. 14 is a circuit diagram showing a part of the control switch W3a different from the plurality of control switches W1a, W2a, W1b, and W2b shown in FIG. 11, and the charge pump CP1 shown in FIG. 11 and FIG. 13, illustrating a state in which the power source voltage output terminal POUT of the control switch W3a is connected to the power input terminal Tc1 of the charge pump CP1.

As shown in FIG. 14, the control switch W3a includes a plurality of control switching elements SWc. The plurality of scanning lines G electrically connected to the plurality of gate electrodes Eg of the plurality of control switching elements SWc of the control switch W3a are different from each other. The plurality of drain electrodes Ed of the plurality of control switching elements SWc of the control switch W3a are electrically bundled and connected to a power source voltage output terminal POUT of the control switch W3a. The power source voltage output terminal POUT of the control switch W3a is electrically connected to the power input terminal Tc1 of the charge pump CP1.

FIG. 14 shows three control switching elements SWc, and the number of the control switching elements SWc provided in the control switch W3a is desirably larger than or equal to the number of the control switching elements SWc provided in the control switch W1a. Thus, the control switch W3a can continue supplying the first power source voltage vdd to the power input terminal Tc1 of the charge pump CP1 for a period for which turning on and off the switch SW of the charge pump CP1 is changed. For example, the control switch W3a includes one hundred control switching elements SWc.

In this embodiment, the plurality of scanning lines G electrically connected to the plurality of gate electrodes Eg of the plurality of control switching elements SWc of the control switch W3a are provided continuously in the direction Y. In addition, the plurality of source electrodes Es of the plurality of control switching elements SWc of the control switch W3a are electrically connected to the same signal line S. As described above, since the control switch W3a comprises the plurality of control switching elements SWc, the control switch W3a can continue outputting the first power source voltage vdd for a plurality of horizontal scanning periods.

The control switch W3a is a control switch different from the above-described control switches W1a, W2a, W1b, and W2b. For example, all the plurality of scanning lines G electrically connected to the control switch W1a may be included in the plurality of scanning lines G electrically connected to the control switch W3a. Alternatively, some of the plurality of scanning lines G electrically connected to the control switch W1a may be included in the plurality of scanning lines G electrically connected to the control switch W3a.

As described above, the charge pump capacitor Ccg is charged with the voltage (first power source voltage vdd) input from the power source voltage output terminal POUT of the control switch W3a, by inputting the first power source voltage vdd from the level shift circuit LS1a to the charge pump capacitor Ccg. After that, the charge pump capacitor Ccg is further charged with the voltage input from the power source voltage output terminal POUT of the control switch W3a. The charge pump CP1 generates the first output voltage gvdd depending on the voltage input from the power source voltage output terminal POUT of the control switch W3a and holds the first output voltage gvdd in the charge pump capacitor Ccg.

Figure 15:
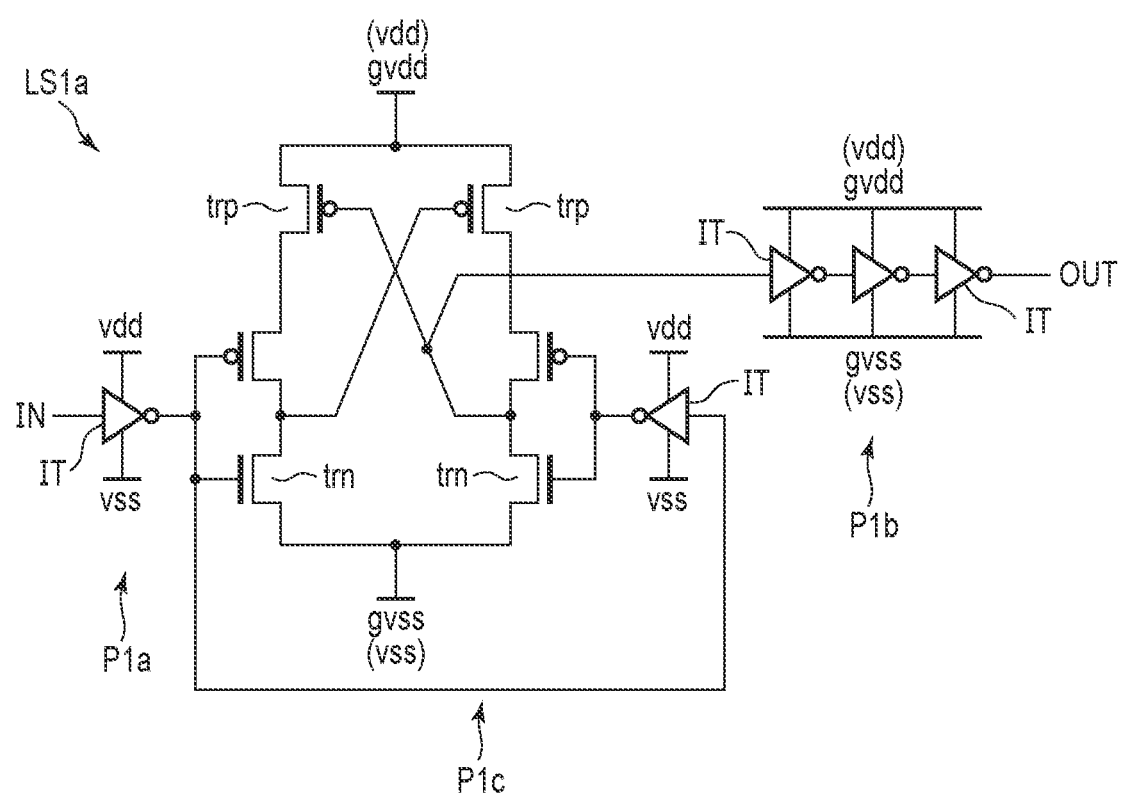
FIG. 15 is a circuit diagram showing one level shift circuit shown in FIG. 11 and FIG. 13.

Next, the level shift circuit LS1a representing the level shift circuits LS1a and LS2a will be described. The elements described herein can be applied to the other level shift circuits LS. FIG. 15 is a circuit diagram showing the level shift circuit LS1a shown in FIG. 11 and FIG. 13.

As shown in FIG. 15, the level shift circuit LS1a includes a front stage part P1a, a rear stage part P1b, and a main body part Plc.

An input terminal IN of the front stage part P1a is electrically connected to the control switch W1a. The front stage part P1a is composed of a single inverter IT. An output terminal OUT of the rear stage part P1b is electrically connected to the charge pump CP1. The rear stage part P1b is composed of three inverters IT that are connected serially. The number of stages of the inverters IT in each of the front stage part P1a and the rear stage part P1b can be variously modified.

The number of inverter stages in the front stage part P1a is not limited to one, but can be an odd number other than one. In this case, the number of inverter stages in the rear stage part P1b is not limited to three, but can be any odd number other than three.

The level shift circuit LS1a may be configured without the front stage part P1a (where the number of inverter stages in the front stage part P1a is 0). Alternatively, the number of inverter stages in the front stage part P1a may be an even number. In this case, the number of inverter stages in the rear stage part P1b may be an even number.

The main body part Plc is electrically connected between the front stage part P1a and the rear stage part P1b. The main body part Plc includes one inverter IT, a plurality of N-channel TFT trn, and a plurality of P-channel TFT trp.

Next, a configuration of a part of the circuit of the liquid crystal display panel PNL shown in FIG. 11 will be described. FIG. 16 is a circuit diagram showing an electrical system for generating the second output voltage gvss, illustrating two control switches W1b and W2b, two level shift circuits LS1b and LS2b, one charge pump CP2, and the like shown in FIG. 11. An electrical system of FIG. 16 is the same as the electrical system shown in FIG. 13 except for elements to be described below.

As shown in FIG. 16, the power source voltage output terminal POUT of the control switch W1b is electrically connected to an input terminal IN of the level shift circuit LS1b. The control switch W1b outputs the first power source voltage vdd and the second power source voltage vss input from the signal line S to the power source voltage output terminal POUT of the own control switch W1b. The power source voltage output terminal POUT of the control switch W2b is electrically connected to an input terminal IN of the level shift circuit LS2b. The control switch W2b outputs the first power source voltage vdd and the second power source voltage vss input from the signal line S to the power source voltage output terminal POUT of the own control switch W2b.

The charge pump CP2 comprises a plurality of switches SW1, SW2, SW3, and SW4, a capacitor Cn, a charge pump capacitor Ccg, a capacitor (smoothing capacitor) Ct, a power input terminal Tc1, and an output terminal OUT. In this embodiment, the switches SW1, SW3, and SW4 are composed of N-channel TFTs, and the switch SW2 is composed of a P-channel TFT.

On the one hand the output signal Sig1 output from the level shift circuit LS1b is supplied to a control terminal (gate electrode) of the switch SW2 via the inverter IV, but on the other hand the output signal Sig1 is supplied to a control terminal (gate electrode) of the switch SW1 without passing through the inverter IV. On the one hand the output signal Sig2 output from the level shift circuit LS2b is supplied to a control terminal (gate electrode) of the switch SW3 without passing through the inverter IV, but on the other hand the output signal Sig2 is supplied to a control terminal (gate electrode) of the switch SW4 without passing through the inverter IV.

For a period of an initial stage of the drive before the charge pump CP1 generates the first output voltage gvdd and the charge pump CP2 generates the second output voltage gvss, first power terminals T1 of the level shift circuits LS1b and LS2b and the inverter IV are precharged with the first power source voltage vdd, and second power terminals T2 of the level shift circuits LS1b and LS2b and the inverter IV are precharged with second power source voltage vss.

For a period after the charge pump CP1 generates the first output voltage gvdd and the charge pump CP2 generates the second output voltage gvss, the first power terminals T1 of the level shift circuits LS1b and LS2b and the inverter IV are supplied with the first output voltage gvdd from the charge pump CP1, and second power terminals T2 of the level shift circuits LS1b and LS2b and the inverter IV are supplied with the second output voltage gvss from the charge pump CP2.

Operations for the period of the initial stage of drive before the charge pump CP1 generates the first output voltage gvdd and the charge pump CP2 generates the second output voltage gvss will be described.

First, the control switch W1b outputs the first power source voltage vdd to the level shift circuit LS1b, and the control switch W2b outputs the first power source voltage vdd to the level shift circuit LS2b. Then, the level shift circuit LS1b outputs the first power source voltage vdd as the output signal Sig1, and the level shift circuit LS2b outputs the second power source voltage vss as the output signal Sig2. The first power source voltage vdd (output signal Sig1) is inverted into the second power source voltage vss by the inverter IV.

Thus, at the charge pump CP2, the switches SW1 and SW2 become the on state, and the switches SW3 and SW4 becomes the off state. A current flows from the charge pump capacitor Ccg to the power input terminal Tc1 via the switch SW1. A voltage level of an electrode EL1 is set to the second power source voltage vss, and a voltage level of an electrode EL2 is set to the reference voltage (gnd) level. As described above, the charge pump capacitor Ccg is charged by outputting the first power source voltage vdd from the level shift circuit LS1b to the charge pump CP2.

After that, the control switch W1b outputs the second power source voltage vss to the level shift circuit LS1b, and the control switch W2b outputs the first power source voltage vdd to the level shift circuit LS2b. Then, the level shift circuit LS1b outputs the second power source voltage vss as the output signal Sig1, and the level shift circuit LS2b outputs the first power source voltage vdd as the output signal Sig2. The second power source voltage vss (output signal Sig1) is inverted into the first power source voltage vdd by the inverter IV.

Thus, at the charge pump CP2, the switches SW1 and SW2 are changed to the off state, and the switches SW3 and SW4 are changed to the on state. A current flows from the electrode EL2 of the charge pump capacitor Ccg to the power input terminal Tc1 via the switch SW3. A voltage level of the electrode EL2 of the charge pump capacitor Ccg drops from the reference voltage (gnd) level (substantially 0V) to the second power source voltage vss level (−5V). Then, the voltage level of the electrode EL1 also drops by −5V by the capacitive coupling of the charge pump capacitor Ccg. The voltage level of the electrode EL1 is set to the second output voltage gvss, i.e., −10V.

As described above, the charge pump capacitor Ccg is further charged to hold the second output voltage gvss by supplying the first power source voltage vdd from the level shift circuit LS2b to the charge pump CP2. As described above, the second output voltage gvss generated at the charge pump CP2 is output to the output terminal OUT via the switch SW4. The charge pump CP2 outputs the second output voltage gvss to the first control electrode structure RE1 (first control electrodes RL1) and the like.

The charge pump CP2 can generate the second output voltage gvss depending on the voltage (second power source voltage vss) input to the power input terminal Tc1. In other words, the charge pump CP2 can make the second power source voltage vss input to the power input terminal Tc1 drop to the second output voltage gvss.

The same control switch W as the control switch W3a shown in FIG. 14 can be used as means for supplying the second power source voltage vss to the power input terminal Tc1 of the charge pump CP2. It is possible to continue outputting the second power source voltage vss to the power input terminal Tc1 of the charge pump CP2 for a plurality of horizontal scanning periods, by using the control switch comprising the control switching element.

The control switch for supplying the second power source voltage vss to the power input terminal Tc1 of the charge pump CP2 is a control switch different from the above-described control switches W1a, W2a, W1b, W2b, and W3a. For example, all the plurality of scanning lines G electrically connected to the control switch W1a may be included in the plurality of scanning lines G electrically connected to the control switch for supplying the second power source voltage vss to the power input terminal Tc1 of the charge pump CP2. Alternatively, some of the plurality of scanning lines G electrically connected to the control switch W1a may be included in the plurality of scanning lines G electrically connected to the control switch for supplying the second power source voltage vss to the power input terminal Tc1 of the charge pump CP2.

As described above, the charge pump capacitor Ccg is charged with the voltage (second power source voltage vss) input to the power input terminal Tc1, by inputting the first power source voltage vdd from the level shift circuit LS1b to the charge pump capacitor Ccg. After that, the charge pump capacitor Ccg is further charged with the voltage input to the power input terminal Tc1. The charge pump CP2 generates the second output voltage gvss depending on the voltage input to the power input terminal Tc1 and holds the second output voltage gvss in the charge pump capacitor Ccg.

The level shift circuits LS1b and LS2b shown in FIG. 16 can also be constituted similarly to the level shift circuit LS1a shown in FIG. 15.

Figure 17:
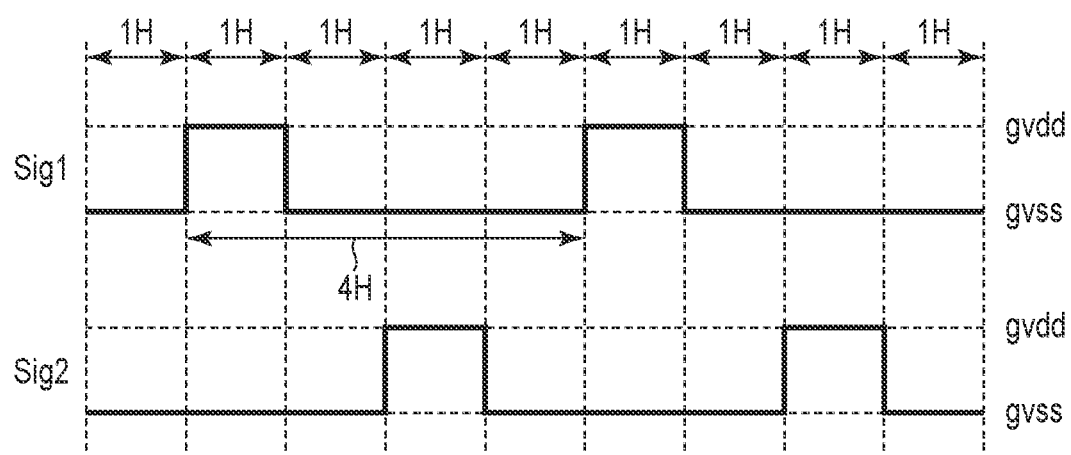
FIG. 17 is a timing chart showing a plurality of output signals shown in FIG. 13.

Next, the plurality of output signals Sig1 and Sig2 shown in FIG. 13 will be exemplified. FIG. 17 is a timing chart showing a plurality of output signals Sig1 and Sig2 shown in FIG. 13.

As shown in FIG. 17, the level shift circuit LS1a outputs the first output voltage gvdd (the first power source voltage vdd in the initial period) to the charge pump CP1 for an arbitrary horizontal scanning period. The charge pump capacitor Ccg is thereby charged. The level shift circuit LS1a outputs the second output voltage gvss (the second power source voltage vss in the initial period) to the charge pump CP1 for a horizontal scanning period following the arbitrary horizontal scanning period. The charge pump capacitor Ccg is thereby held in the charged state.

The level shift circuit LS2a outputs the first output voltage gvdd (the first power source voltage vdd in the initial period) to the charge pump CP1 for a second horizontal scanning period after the arbitrary horizontal scanning period. The charge pump capacitor Ccg is thereby further charged. The level shift circuit LS2a outputs the second output voltage gvss (the second power source voltage vss in the initial period) to the charge pump CP1 for sequentially following horizontal scanning periods. The charge pump capacitor Ccg is thereby further held in the charged state. The first output voltage gvdd is held in the charge pump capacitor Ccg.

A cycle of each of the output signals Sig1 and Sig2 corresponds to four horizontal scanning periods. In other words, a cycle for driving the charge pump CP1 is four horizontal scanning periods.

According to the electronic device 100 of the first embodiment constituted as described above, the electronic device 100 comprises the liquid crystal display device DSP, the camera 1a, and the like. The liquid crystal display device DSP comprises the liquid crystal display panel PNL. The liquid crystal display panel PNL includes the incident light control area PCA opposed to the camera 1a. For this reason, the liquid crystal display panel PNL enables visible light from the outside to be selectively transmitted to the camera 1a.

Each of the control switches W1a, W2a, W1b, W2b, and W3a comprises a plurality of control switching elements SWc. For this reason, the frequency of the signal output from each of the control switches W1a, W2a, W1b, W2b, and W3a can be made higher than the frequency of the signal output from the pixel switching element SWp (pixel switch).

The signal line driving circuit SD outputs the image signal Vsig to each of the signal lines S. The voltage level applied to the signal line S by the signal line driving circuit SD falls within a range between −5V and +5V. For this reason, the pixel electrode PE is driven with the image signal Vsig of −5V to +5V.

In contrast, the voltage level applied to the control electrode RL (control electrode structure RE) is −10V and +10V. The control electrode RL (control electrode structure RE) is driven at the voltage level higher than the voltage level for driving the pixel electrode PE.

For this reason, lack of write to the control electrode RL (control electrode structure RE) can be suppressed. For example, in a case where the mode in the incident light control area PCA of the liquid crystal display panel PNL is the normally-black mode, a problem that a sufficient quantity of transmitted light cannot be obtained when the incident light control area PCA of the liquid crystal display panel PNL is switched to a transmitted state (white display state) can be solved.

In a case where the mode in the incident light control area PCA of the liquid crystal display panel PNL is the normally-white mode, a problem that a pinhole-shot image or an IR-shot image becomes unclear can be solved. The pinhole shooting is the shooting performed of switching the only second incident light adjustment area TA2 of the incident light control area PCA to the transmitted state. The IR shooting is the shooting performed of switching the entire incident light control area PCA to the light-shielding state (i.e., a state that blocks visible light).

The control electrode RL (control electrode structure RE) is connected to the signal line S via the control switch W, the level shift circuit LS, the charge pump CP, and the like. Control circuits such as the control switch W, the level shift circuit LS, and the charge pump CP are located in the incident light control area PCA (light-shielding area LSA). The first output voltage gvdd and the second output voltage gvss supplied to the control electrode RL (control electrode structure RE) can be generated in the incident light control area PCA.

In the display area DA, lines to which voltages having high absolute values such as the first output voltage gvdd and the second output voltage gvss are applied do not need to be drawn. Interference with the pixels PX in the display area DA can be thereby suppressed.

Next, several modified examples of the circuit configuration of the electrical system for generating the first output voltage will be described. The circuit configuration of the electrical system for generating the first output voltage is not limited to the example shown in FIG. 13 but can be variously modified.

Modified Example 1 of First Embodiment

Next, a modified example 1 of the above embodiment will be described. FIG. 18A is a circuit diagram showing the modified example 1 of the electric system shown in FIG. 13, illustrating two control switches W1a and W2a, two level shift circuits LS1a and LS2a, one charge pump CP1, and the like. The electronic device 100 is constituted similarly to the above-described embodiment except for constituent elements to be described in the modified example 1.

As shown in FIG. 18A, each of the switches SW1, SW2, SW3, and SW4 of the charge pump CP1 may be composed of a P-channel TFT or an N-channel TFT. All the switches SW1, SW2, SW3, and SW4 may be composed of P-channel TFTs.

In this case, interposing the inverter IV between the level shift circuit LS and the charge pump CP1 or a position of the inverter IV in a case where the inverter IV is interposed may be adjusted. In this case, on the one hand the output signal Sig1 output from the level shift circuit LS1a is supplied to the control terminal (gate electrode) of the switch SW1 via the inverter IV, but on the other hand the output signal Sig1 is supplied to the control terminal (gate electrode) of the switch SW2 via the inverter IV.

The same advantages as those of the above-described embodiment can also be obtained from a modified example 1 constituted as described above.

The techniques described with reference to FIG. 18A can also be applied to the circuit shown in FIG. 16 (i.e., the electrical system for generating the second output voltage). For example, in FIG. 16, all the switches SW1, SW2, SW3, and SW4 may be composed of N-channel TFTs. The level shift circuit LS1b may be electrically connected to the charge pump CP1 without interposing the inverter IV.

Modified Example 2 of First Embodiment

Next, a modified example 2 of the embodiment will be described. FIG. 18B is a circuit diagram showing a modified example 2 of the electric system shown in FIG. 13, illustrating two control switches W1a and W2a, two level shift circuits LS1a and LS2a, one charge pump CP1, and the like. The electronic device 100 is constituted similarly to the above-described embodiment except for constituent elements to be described in the modified example 2.

As shown in FIG. 18B, all the plurality of switches SW1, SW2, SW3, and SW4 of the charge pump CP1 may be composed of N-channel TFTs. In this example, the output signal Sig1 output from the level shift circuit LS1a and the output signal Sig2 output from the level shift circuit LS2a have phases opposite to each other. In addition, the level shift circuit LS1a or the level shift circuit LS2a may be connected to the charge pump CP1 via the inverter IV as needed.

The same advantages as those of the above-described embodiment can also be obtained from the modified example 2 constituted as described above.

Modified Example 3 of First Embodiment

Next, a modified example 3 of the above embodiment will be described. FIG. 18C is a circuit diagram showing the modified example 3 of the electric system shown in FIG. 13, illustrating two control switches W1a and W2a, two level shift circuits LS1a and LS2a, one charge pump CP1, and the like. The electronic device 100 is constituted similarly to the above-described embodiment except for constituent elements to be described in the modified example 3.

As shown in FIG. 18C, the charge pump CP1 comprises a power input terminal Tc2 instead of the capacitor Cn. The power input terminal Tc1 is electrically connected to the switch SW1 among the plurality of switches SW1, SW2, SW3, and SW4. The power input terminal Tc2 is electrically connected to the switch SW3 among the plurality of switches SW1, SW2, SW3, and SW4. The power input terminal Tc2 is supplied with the first output voltage gvdd from a charge pump CP of the other electrical system.

Thus, the charge pump CP1 cannot generate the first output voltage gvdd twice as large as the first power source voltage vdd, but first output voltage gvdd1, i.e., +15V, which is three times as large as the first power source voltage vdd.

The same advantages as those of the above-described embodiment can also be obtained from the modified example 3 constituted as described above.

The techniques described with reference to FIG. 18C can also be applied to the circuit shown in FIG. 16 (i.e., the electrical system for generating the second output voltage). For example, in FIG. 16, the power input terminal Tc2 may be provided instead of the capacitor Cn, and the power input terminal Tc2 may be supplied with the second output voltage gvss from a charge pump CP of the other electrical system.

Second Embodiment

Next, a second embodiment will be explained. FIG. 19 is a circuit diagram showing a part of an electronic device 100 according to the second embodiment, together with an electrical system for generating a first output voltage gvdd, illustrating one control switch W1a, a plurality of inverters IV, one AND circuit AN, one NOR circuit NR, one level shift unit SIa, one charge pump CP1, and the like. The electronic device 100 is constituted similarly to the above-described first embodiment except for constituent elements described in the second embodiment.

As shown in FIG. 19, a control switch group Wa comprises the control switch W1a, but does not comprise a control switch W2a. The plurality of inverters IV, the AND circuit AN, and the NOR circuit NR are electrically connected between the control switch W1a and the level shift unit SIa. The AND circuit AN is an AND circuit, and the NOR circuit NR is a NOR circuit.

The AND circuit AN includes a first input terminal IN1 electrically connected to a power source voltage output terminal POUT of the control switch W1a via two inverters IV, a second input terminal IN2 electrically connected to the power source voltage output terminal POUT via four inverters IV, and a first output terminal OUT1 electrically connected to a level shift circuit LS1a. The number of inverters IV connected to the second input terminal IN2 is larger by two than the number of inverters IV connected to the first input terminal IN1. For this reason, it can be said that the second input terminal IN2 is connected to the power source voltage output terminal POUT via delay circuits as compared with the first input terminal IN1.

The NOR circuit NR includes a third input terminal IN3 electrically connected to the power source voltage output terminal POUT via two inverters IV, a fourth input terminal IN4 electrically connected to the power source voltage output terminal POUT via four inverters IV, and a second output terminal OUT2 electrically connected to a level shift circuit LS2a. It can be said that the fourth input terminal IN4 is connected to the power source voltage output terminal POUT via a delay circuit as compared with the third input terminal IN3.

An output signal Sig1a is input to the first input terminal IN1 of the AND circuit AN and the third input terminal IN3 of the NOR circuit NR. An output signal Sig1b is input to the second input terminal IN2 of the AND circuit AN and the fourth input terminal IN4 of the NOR circuit NR.

In addition, an output signal Sig3 is input from the AND circuit AN to the level shift circuit LS1a. An output signal Sig4 is input from the NOR circuit NR to the level shift circuit LS2a.

The plurality of inverters IV, the AND circuit AN, and the NOR circuit NR constitute a two-phase circuit. In each of the plurality of inverters IV, the AND circuit AN, and the NOR circuit NR, a first power terminal is supplied with the first output voltage gvdd from the charge pump CP1, and a second power terminal T2 is supplied with a second output voltage gvss from a charge pump CP2.

FIG. 20 is a timing chart showing a plurality of output signals Sig1a, Sig1b, Sig3, and Sig4 shown in FIG. 19.

As shown in FIG. 19 and FIG. 20, first, when a voltage level of the output signal Sig1a becomes the first output voltage gvdd, voltage levels of the output signals Sig3 and Sig4 become the second output voltage gvss.

Then, when a voltage level of the output signal Sig1b is changed to the first output voltage gvdd after a small delay from the output signal Sig1a, the voltage level of the output signal Sig3 is changed to the first output voltage gvdd. Then, the level shift circuit LS1a outputs the first output voltage gvdd to the charge pump CP1. The charge pump capacitor Ccg of the charge pump CP1 is thereby charged.

After that, when the voltage level of the output signal Sig1a is changed to the second output voltage gvss, the voltage levels of the output signals Sig3 and Sig4 become the second output voltage gvss. The charge pump capacitor Ccg is thereby held in the charged state.

Then, when the voltage level of the output signal Sig1b is changed to the second output voltage gvss after a small delay from the output signal Sig1a, the voltage level of the output signal Sig4 is changed to the first output voltage gvdd. The level shift circuit LS2a outputs the first output voltage gvdd to the charge pump CP1. The charge pump capacitor Ccg is thereby further charged.

After that, when the voltage level of the output signal Sig1a is changed to the first output voltage gvdd again, the voltage levels of the output signals Sig3 and Sig4 become the second output voltage gvss. The charge pump capacitor Ccg is thereby further held in the charged state. The first output voltage gvdd is held in the charge pump capacitor Ccg.

A cycle of each of the output signals Sig3 and Sig4 corresponds to two horizontal scanning periods. In other words, a cycle for driving the charge pump CP1 is two horizontal scanning periods.

The same advantages as those of the above-described first embodiment can also be obtained from the second embodiment constituted as described above. In this embodiment, the charge pump CP1 can be driven by increasing the frequency as compared with the above-described first embodiment. In the charge pump CP1, rise from the first power source voltage vdd to the first output voltage gvdd can be further desirably performed. In a case of applying the above technique to the charge pump CP2, drop from the second power source voltage vss to the second output voltage gvss can be further desirably performed.

The plurality of inverters IV, the AND circuit AN, and the NOR circuit NR constitute a two-phase circuit. For this reason, the control switch group Wa can be formed without the control switch W2a.

Modified Example 1 of Second Embodiment

Figure 21:
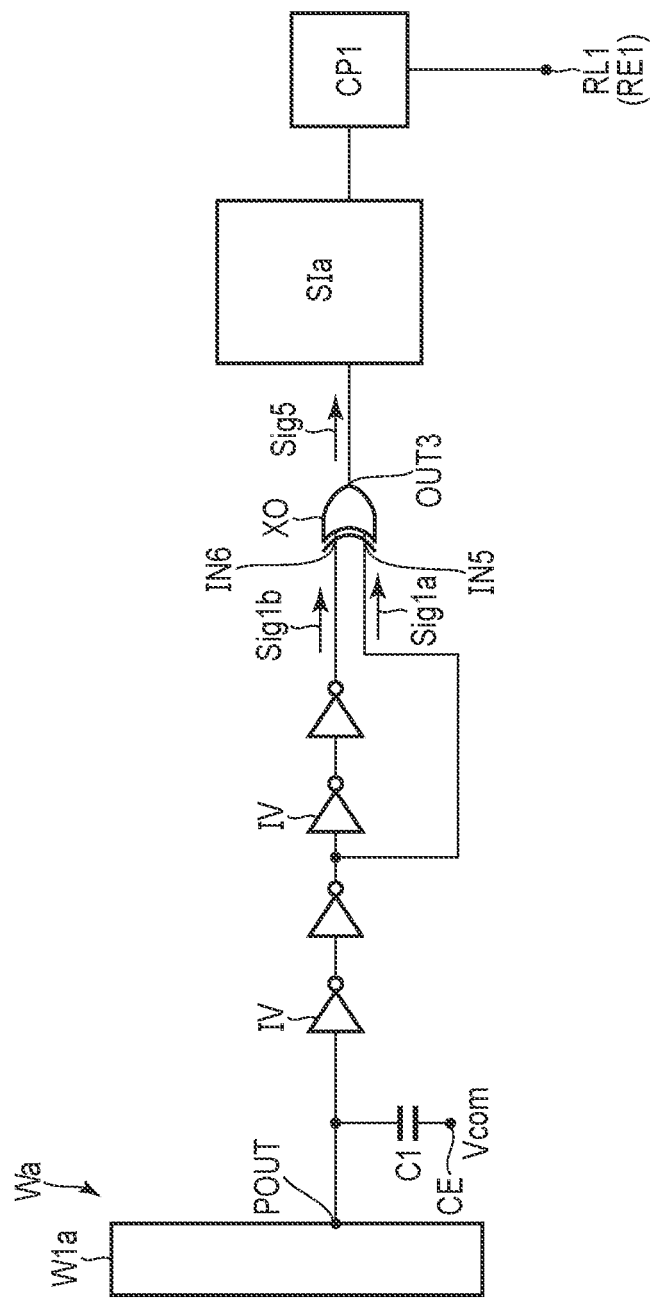

Next, a modified example 1 of the second embodiment will be described. FIG. 21 is a circuit diagram showing the modified example 1 of a part of the electronic device 100 according to the second embodiment, together with the electrical system for generating the first output voltage gvdd, illustrating one control switch W1a, a plurality of inverters IV, one exclusive-OR circuit XO, one level shift unit SIa, one charge pump CP1, and the like. FIG. 22 is a timing chart showing a plurality of output signals Sig1a, Sig1b, and Sig5 shown in FIG. 21.

As shown in FIG. 21, a first substrate SUB1 (liquid crystal display panel PNL) comprises the exclusive-OR circuit XO instead of two inverters IV, the AND circuit AN, and the NOR circuit NR of the second embodiment (FIG. 19). The exclusive-OR circuit XO comprises a first input terminal IN5, a second input terminal IN6, and an output terminal OUT5. The first input terminal IN5 and the second input terminal IN6 are electrically connected to the power source voltage output terminal POUT of the control switch W1a.

More specifically, the first input terminal IN5 is electrically connected to an output terminal of the second inverter IV from the control switch W1a side. The second input terminal IN6 is electrically connected to the power source voltage output terminal POUT via four inverters IV. For this reason, two inverters IV on the second input terminal IN6 side may be referred to as delay circuits. The second input terminal IN6 is electrically connected to the power source voltage output terminal POUT via the delay circuits.

The output signal Sig1a is input to the first input terminal IN5 of the exclusive-OR circuit XO via two inverters IV. The output signal Sig1b is input to the second input terminal IN6 of the exclusive-OR circuit XO via four inverters IV. The output signal Sig5 is input from the exclusive-OR circuit XO to the level shift unit SIa.

As shown in FIG. 21 and FIG. 22, a cycle of the output signal Sig1b is the same as a cycle of the output signal Sig1a. The output signal Sig1b is delayed from the output signal Sig1a by a quarter of the cycle of the output signal Sig1b. In a modified example 1, the output signal Sig1b is delayed from the output signal Sig1a by one horizontal scanning period (1H).

A cycle of the output signal Sig5 corresponds to two horizontal scanning periods. In other words, a cycle for driving the charge pump CP1 is two horizontal scanning periods.

The same advantages as those of the above-described second embodiment can also be obtained from a modified example 1 constituted as described above.

Modified Example 2 of Second Embodiment

Next, modified example 2 of the second embodiment will be described. FIG. 23 is a circuit diagram showing modified example 2 of a part of the electronic device 100 according to the second embodiment, together with the electrical system for generating the first output voltage gvdd, illustrating one control switch W1a, a plurality of inverters IV, one RC circuit RCC, one exclusive-OR circuit XO, one level shift unit SIa, one charge pump CP1, and the like.

As shown in FIG. 23, the first substrate SUB1 (liquid crystal display panel PNL) constitutes a delay circuit with a serial RC circuit RCC instead of two inverters IV of the modified example 1 (FIG. 21). The second input terminal IN6 of the exclusive-OR circuit XO is electrically connected to the power source voltage output terminal POUT of the control switch W1a via the RC circuit RCC.

The RC circuit RCC comprises a resistor RT and a capacitor C3. The resistor RT is electrically connected between an output terminal of the inverter IV of the last stage viewed from the control switch W1a side and the second input terminal IN6. In the capacitor C3, one of electrodes is electrically connected to a node between the resistor RT and the second input terminal IN6, and the other electrode is electrically connected to the ground (gnd).

Waveforms of a plurality of output signals Sig1a, Sig1b, and Sig5 are the same as those of the modified example 1 (FIG. 22).

The same advantages as those of the above-described second embodiment can also be obtained from the modified example 2 constituted as described above.

Third Embodiment

Next, a third embodiment will be explained. FIG. 24 is a circuit diagram showing a part of an electronic device 100 according to a third embodiment, illustrating one control switch group Wa, one level shift unit SIa, one charge pump CP1, a first control electrode structure RE1 (first control electrode RL1), a third control electrode structure RE3 (third control electrode RL3), a fifth control electrode structure RE5 (fifth control electrode RL5), a plurality of switches SSW1a, SSW1b, SSW1c, SSW3a, SSW3b, and SSW3c, and the like. The electronic device 100 is constituted similarly to the first embodiment except for constituent elements described in the third embodiment.

As shown in FIG. 24, the third control electrode structure RE3 and the fifth control electrode structure RE5 are load portions other than the first control electrode structure RE1 and the pixel electrodes PE. The first substrate SUB1 (liquid crystal display panel PNL) further comprises a plurality of switches SSW1a, SSW1b, SSW1c, SSW3a, SSW3b, and SSW3c.

The switch SSW1a is electrically connected between the charge pump CP1 and the first control electrode RL1 to change outputting or not outputting the first output voltage gvdd to the first control electrodes RL1. The switch SSW1b is electrically connected between the charge pump CP1 and the fifth control electrode RL5 to change outputting or not outputting the first output voltage gvdd to the fifth control electrodes RL5. The switch SSW1c is electrically connected between the charge pump CP1 and the third control electrode RL3 to change outputting or not outputting the first output voltage gvdd to the third control electrodes RL3.

A plurality of load portions can be selectively driven with one electrical system for generating the first output voltage gvdd.

The first control electrode RL1 is electrically connected to the ground (gnd) via the switch SSW3a. The fifth control electrode RL5 is electrically connected to the ground (gnd)

via the switch SSW3b. The third control electrode RL3 is electrically connected to the ground (gnd) via the switch SSW3c.

For this reason, the potentials of the first control electrode RL1, the fifth control electrode RL5, and the third control electrode RL3 can be selectively initialized.

The same advantages as those of the above-described first embodiment can also be obtained from the third embodiment constituted as described above.

While the embodiments and modified examples have been described, the embodiments and the modified examples have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the above-mentioned techniques are not limited to the application to the above-described liquid crystal display panel PNL, but may also be applied to the other liquid crystal display panels and to various display panels comprising the control switches.

In addition, the above-described techniques are not limited to the application to the above-described electronic device 100, but may also be applied to various electronic devices.

What is claimed is:

1. A display panel comprising:
a plurality of scanning lines;
a plurality of signal lines;
a pixel switching element;
a pixel electrode; and
a first control switch including a plurality of first control switching elements,
the pixel switching element being composed of a transistor and including a gate electrode electrically connected to a corresponding scanning line among the plurality of scanning lines, a source electrode electrically connected to a corresponding signal line among the plurality of signal lines, and a drain electrode electrically connected to the pixel electrode,
each of the first control switching elements being composed of a transistor and including a gate electrode electrically connected to a corresponding scanning line among the plurality of scanning lines, a source electrode electrically connected to a corresponding signal line among the plurality of signal lines, and a drain electrode,
the plurality of scanning lines electrically connected to the plurality of gate electrodes of the plurality of first control switching elements being different from each other,
the drain electrodes of the plurality of first control switching elements being electrically bundled and connected to power source voltage output terminal of the first control switch.

2. The display panel of claim 1, wherein
the plurality of scanning lines extend in a first direction,
the plurality of signal lines extend in a second direction intersecting the first direction, and
the plurality of scanning lines electrically connected to the plurality of gate electrodes of the plurality of first control switching elements are continuously provided in the second direction.

3. The display panel of claim 1, wherein
the plurality of source electrodes of the plurality of first control switching elements are electrically connected to a same signal line.

4. The display panel of claim 1, further comprising:
a first level shift circuit;
a first charge pump; and
a first load portion other than the pixel electrode,
wherein
the first control switch outputs a first power source voltage input from the signal line, to the power source voltage output terminal,
the first level shift circuit outputs the first power source voltage to the first charge pump,
the first charge pump generates a first output voltage and outputs the first output voltage to the first load portion, and
an absolute value of the first output voltage is larger than an absolute value of the first power source voltage.

5. The display panel of claim 4, further comprising:
a second control switch including a plurality of second control switching elements; and
a second level shift circuit,
wherein
each of the second control switching elements is composed of a transistor and includes a gate electrode electrically connected to a corresponding scanning line among the plurality of scanning lines, a source electrode electrically connected to a corresponding signal line among the plurality of signal lines, and a drain electrode,
the plurality of scanning lines electrically connected to the plurality of gate electrodes of the plurality of second control switching elements are different from each other,
the drain electrodes of the plurality of second control switching elements are electrically bundled and connected to a power source voltage output terminal of the second control switch,
the first charge pump includes a charge pump capacitor, and
the charge pump capacitor is charged by inputting the first power source voltage from the first level shift circuit, and further charged by inputting the first power source voltage from the second level shift circuit, and holds the first output voltage.

6. The display panel of claim 4, further comprising:
a second level shift circuit outputting the first power source voltage to the first charge pump;
a delay circuit;
an AND circuit including a first input terminal electrically connected to the power source voltage output terminal, a second input terminal electrically connected to the power source voltage output terminal via the delay circuit, and a first output terminal electrically connected to the first level shift circuit; and
a NOR circuit including a third input terminal electrically connected to the power source voltage output terminal, a fourth input terminal electrically connected to the power source voltage output terminal via the delay circuit, and a second output terminal electrically connected to the second level shift circuit.

7. The display panel of claim 4, further comprising:
a delay circuit; and
an exclusive-OR circuit including a first input terminal electrically connected to the power source voltage output terminal, a second input terminal electrically connected to the power source voltage output terminal via the delay circuit, and a first output terminal electrically connected to the first level shift circuit.

8. The display panel of claim 4, further comprising:
a serial RC circuit; and
an exclusive-OR circuit including a first input terminal electrically connected to the power source voltage output terminal, a second input terminal electrically connected to the power source voltage output terminal via the RC circuit, and a first output terminal electrically connected to the first level shift circuit.

9. The display panel of claim 4, further comprising:
a display area; and
an incident light control area including an incident light adjustment area where an amount of transmitted light is adjustable, and a light-shielding area,
wherein
the pixel switching element and the pixel electrode are located in the display area, and
the first load portion is a control electrode located in the incident light adjustment area.

10. The display panel of claim 9, wherein
each of the first control switch, the first level shift circuit, and the first charge pump is located in the light-shielding area.

11. The display panel of claim 4, further comprising:
a second control switch including a plurality of second control switching elements;
a second level shift circuit; and
a second charge pump,
wherein
each of the second control switching elements is composed of a transistor and includes a gate electrode electrically connected to a corresponding scanning line among the plurality of scanning lines, a source electrode electrically connected to a corresponding signal line among the plurality of signal lines, and a drain electrode,
the plurality of scanning lines electrically connected to the plurality of gate electrodes of the plurality of second control switching elements are different from each other,
the drain electrodes of the plurality of second control switching elements are electrically bundled and connected to a power source voltage output terminal of the second control switch,
the second control switch outputs the first power source voltage input from the signal line, to the power source voltage output terminal of the own second control switch,
the second level shift circuit outputs the first power source voltage to the second charge pump, and
the second charge pump generates a second output voltage and outputs the second output voltage to the first load portion.

12. The display panel of claim 4, further comprising:
a second load portion other than the pixel electrode and the first load portion;
a first drive switch connected between the first charge pump and the first load portion to change outputting or not outputting the first output voltage to the first load portion; and
a second drive switch connected between the first charge pump and the second load portion to change outputting or not outputting the first output voltage to the second load portion.

13. The display panel of claim 4, further comprising:
a second control switch including a plurality of second control switching elements,
wherein
each of the second control switching elements is composed of a transistor and includes a gate electrode electrically connected to a corresponding scanning line among the plurality of scanning lines, a source electrode electrically connected to a corresponding signal line among the plurality of signal lines, and a drain electrode,
the plurality of scanning lines electrically connected to the plurality of gate electrodes of the plurality of second control switching elements are different from each other,
the drain electrodes of the plurality of second control switching elements are electrically bundled and connected to a power source voltage output terminal of the second control switch,
the first charge pump includes a power source input terminal electrically connected to the power source voltage output terminal of the second control switch, and a charge pump capacitor, and
when the first power source voltage is input from the first level shift circuit to the charge pump capacitor, the charge pump capacitor is charged with a voltage input from the power source voltage output terminal of the second control switch, then the charge pump capacitor is further charged with a voltage input from the power source voltage output terminal of the second control switch, generates a first output voltage depending on the voltage input from the power source voltage output terminal of the second control switch, and holds the first output voltage.

14. An electronic device comprising:
a display panel including a plurality of scanning lines, a plurality of signal lines, a pixel switching element, a pixel electrode, an incident light control area, a first control switch including a plurality of first control switching elements, a control electrode located in the incident light control area, a first level shift circuit, and a first charge pump; and
an imaging device obtaining information of light transmitted through the incident light control area of the display panel,
the pixel switching element being composed of a transistor and including a gate electrode electrically connected to a corresponding scanning line among the plurality of scanning lines, a source electrode electrically connected to a corresponding signal line among the plurality of signal lines, and a drain electrode electrically connected to the pixel electrode,
each of the first control switching elements being composed of a transistor and including a gate electrode electrically connected to a corresponding scanning line among the plurality of scanning lines, a source electrode electrically connected to a corresponding signal line among the plurality of signal lines, and a drain electrode,
the plurality of scanning lines electrically connected to the plurality of gate electrodes of the plurality of first control switching elements being different from each other,
the plurality of drain electrodes of the plurality of first control switching elements being electrically bundled and connected to a power source voltage output terminal of the first control switch, the first control switch outputting a first power source voltage input from the signal line, to the power source voltage output terminal, the first level shift circuit outputting the first power source voltage to the first charge pump, the first charge pump generating a first output voltage and outputting the first output voltage to the control electrode, an absolute value of the first output voltage being larger than an absolute value of the first power source voltage.

15. The electronic device of claim 14, wherein the plurality of scanning lines extend in a first direction, the plurality of signal lines extend in a second direction intersecting the first direction, and the plurality of scanning lines electrically connected to the plurality of gate electrodes of the plurality of first control switching elements are continuously provided in the second direction.

16. The electronic device of claim 14, wherein the plurality of source electrodes of the plurality of first control switching elements are electrically connected to a same signal line.

* * * * *